United States Patent
Partovi et al.

(10) Patent No.: US 8,604,854 B1
(45) Date of Patent: Dec. 10, 2013

(54) PSEUDO SINGLE-PHASE FLIP-FLOP (PSP-FF)

(75) Inventors: Hamid Partovi, Los Altos, CA (US); Alfred Yeung, Fremont, CA (US); Luca Ravezzi, San Francisco, CA (US); John Ngai, Boxborough, MA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 13/412,679

(22) Filed: Mar. 6, 2012

Related U.S. Application Data

(63) Continuation-in-part of application No. 13/255,044, filed on Sep. 6, 2011, and a continuation-in-part of application No. 13/077,949, filed on Mar. 31, 2011, now abandoned, and a continuation-in-part of application No. 13/160,569, filed on Jun. 15, 2011.

(51) Int. Cl.
*H03K 3/289* (2006.01)
*H03K 3/356* (2006.01)

(52) U.S. Cl.
USPC .......................... 327/203; 327/199; 327/202

(58) Field of Classification Search
USPC .......................................... 327/202, 203, 218
See application file for complete search history.

(56) References Cited

U.S. PATENT DOCUMENTS

2007/0022344 A1 * 1/2007 Branch et al. ................. 714/731

* cited by examiner

*Primary Examiner* — John Poos
(74) *Attorney, Agent, or Firm* — Turocy & Watson, LLP

(57) ABSTRACT

Disclosed herein is a pseudo single-phase flip-flop. The master section includes a pre-dissipation stage and a first keeper. The pre-dissipation stage discharges the first keeper to the mDb second binary value, and selectively charges the first keeper with the mDb first binary value in the master pass mode. The pre-dissipation stage selectively prevents the first keeper from charging to the mDb first binary value in response to one of the clock phases. The slave section includes a pre-charge stage, a second keeper, a post-dissipation stage, and a third keeper. The second keeper maintains a first binary value in a slave pass mode when the mDb signal has a second binary value. The second keeper supports the second binary value in the slave pass mode when the mDb signal has the first binary value. The third keeper maintains the Q signal binary value during the slave hold mode.

20 Claims, 19 Drawing Sheets

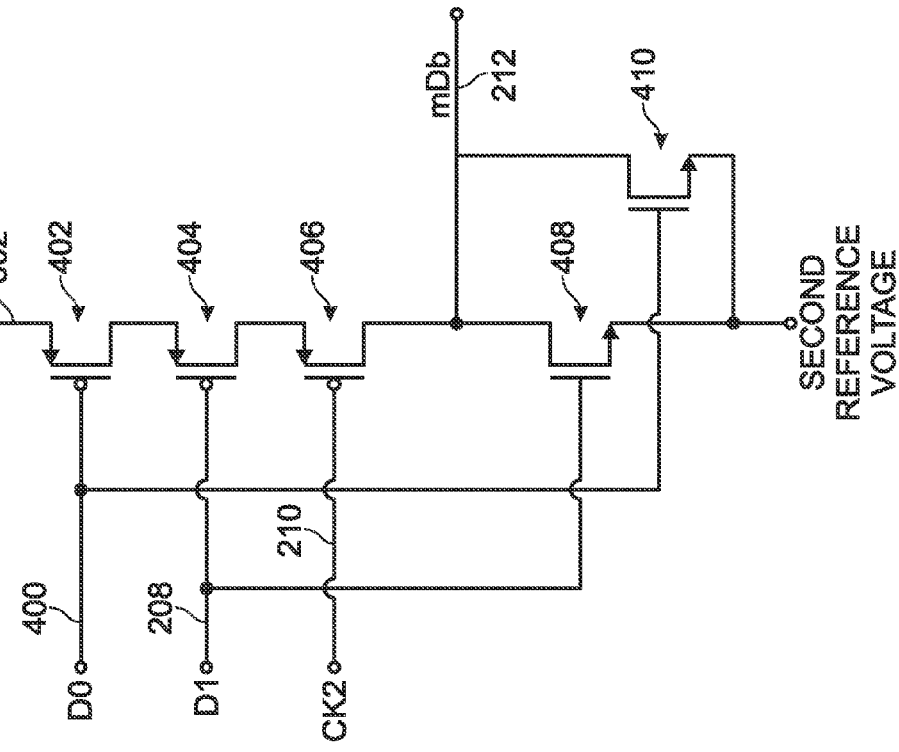
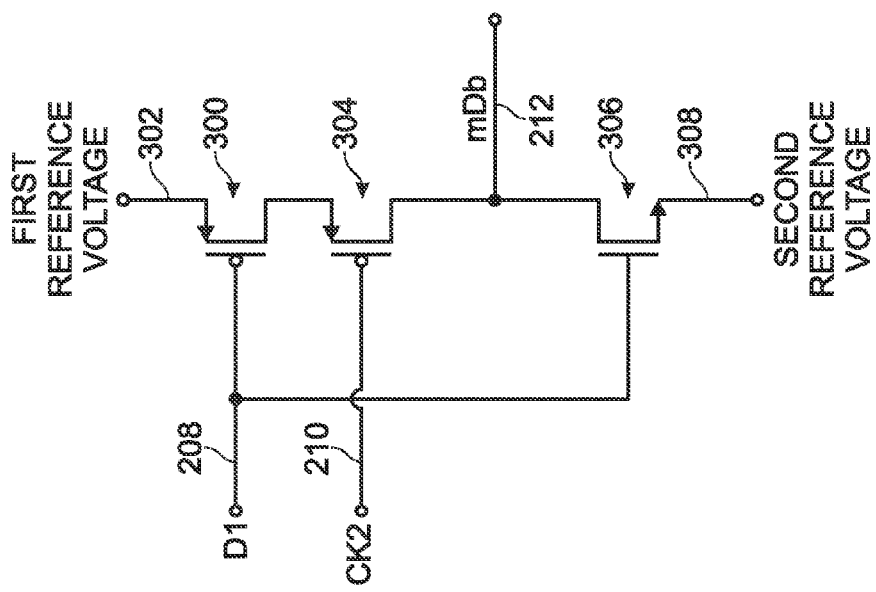

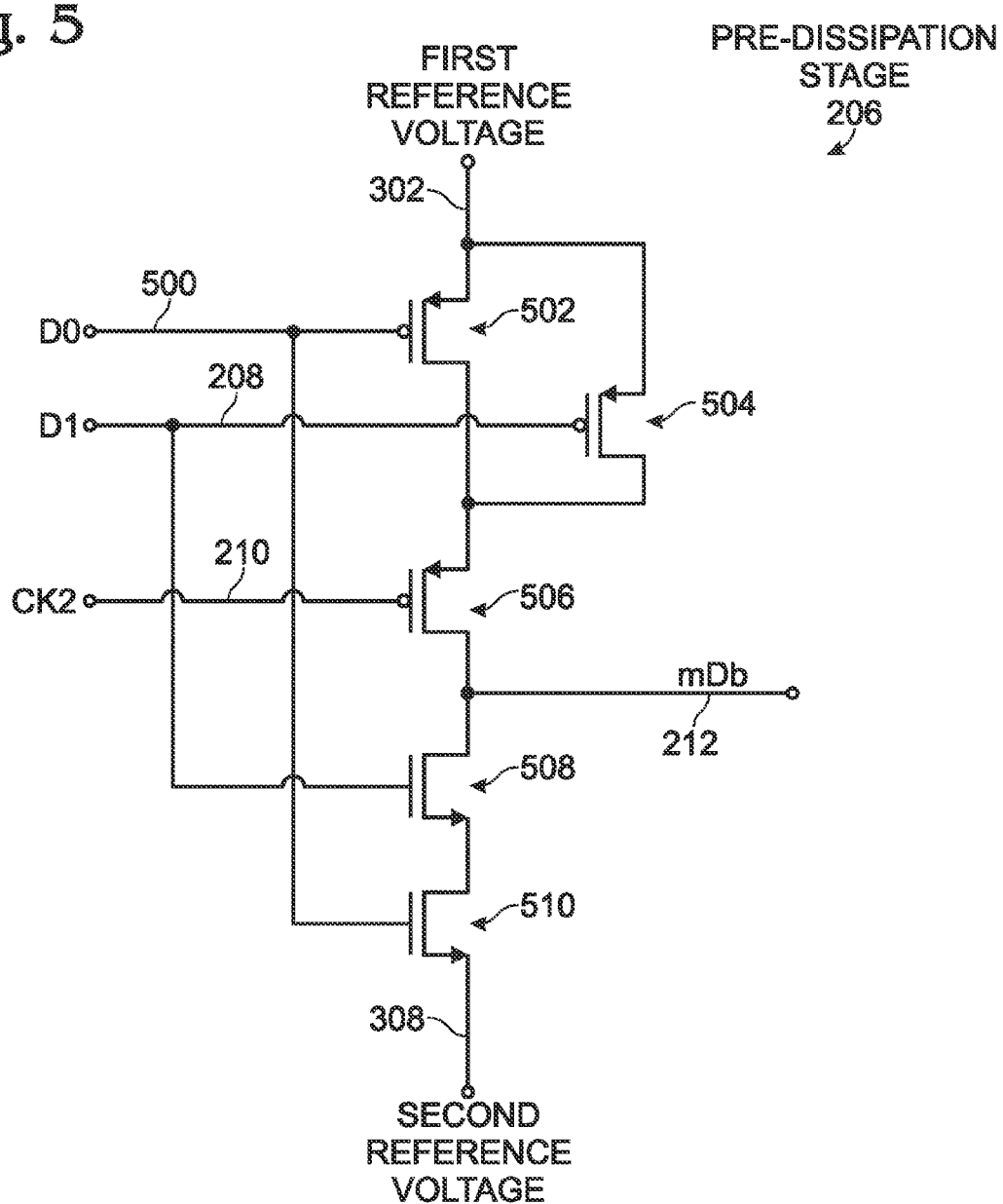

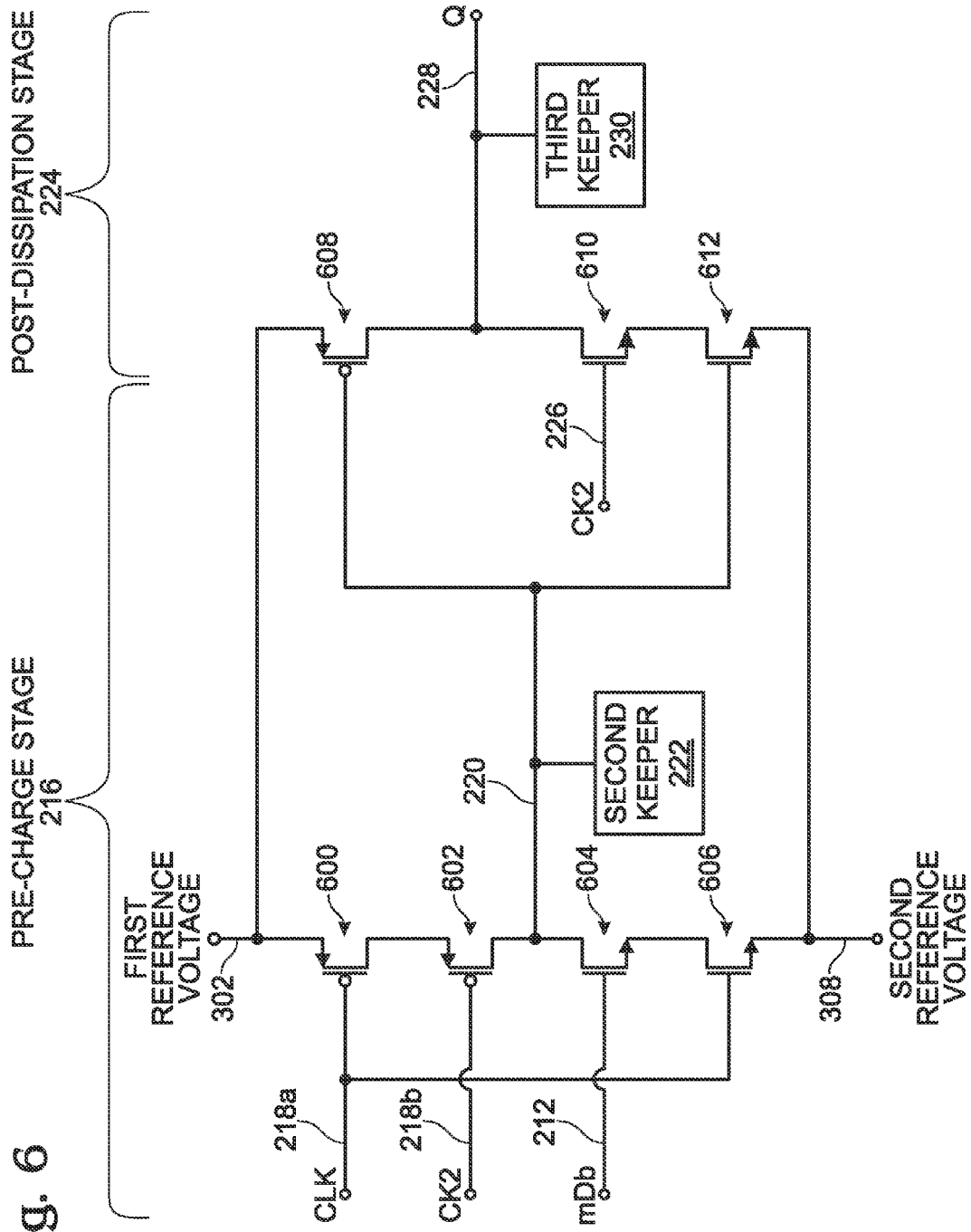

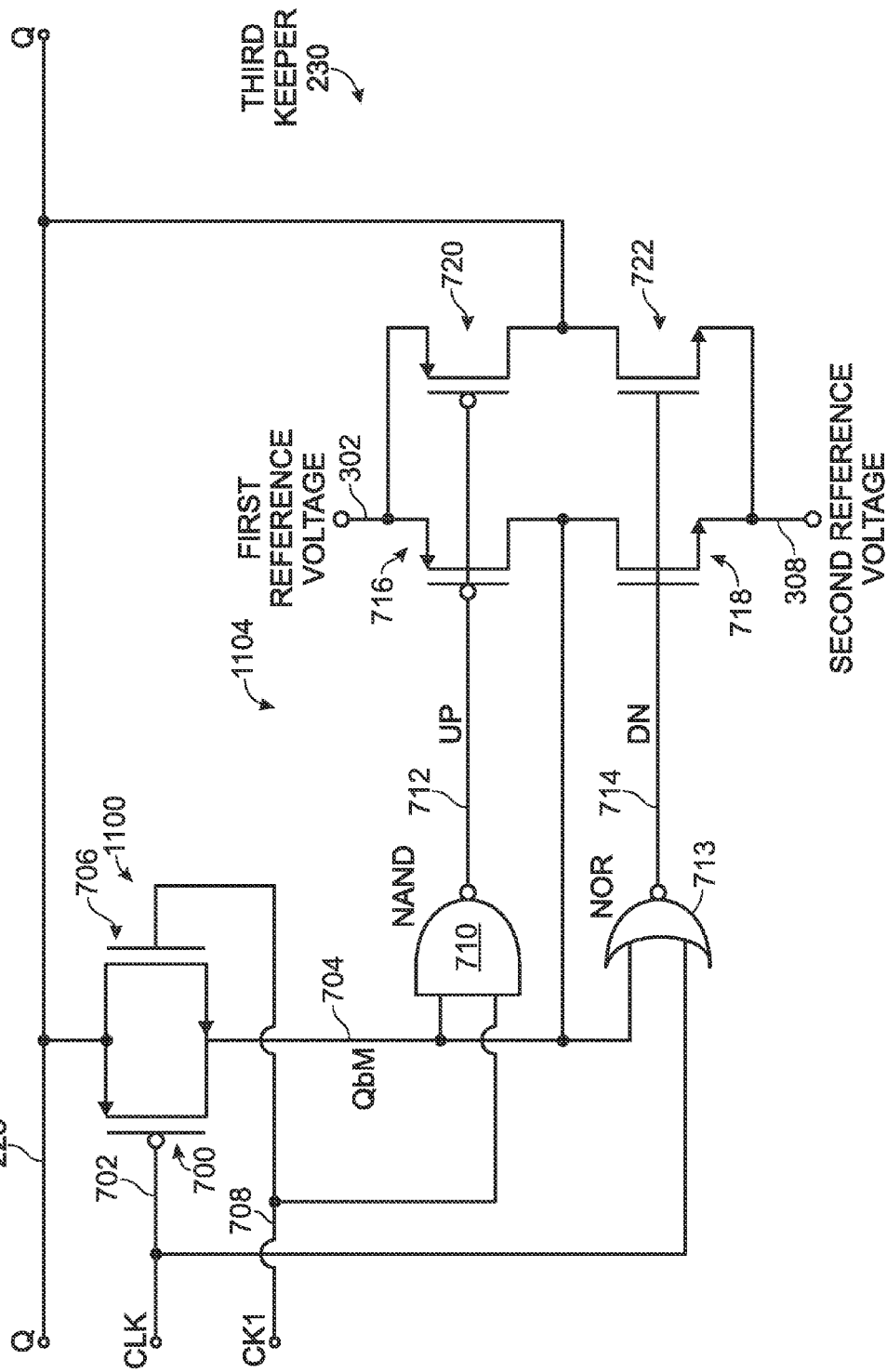

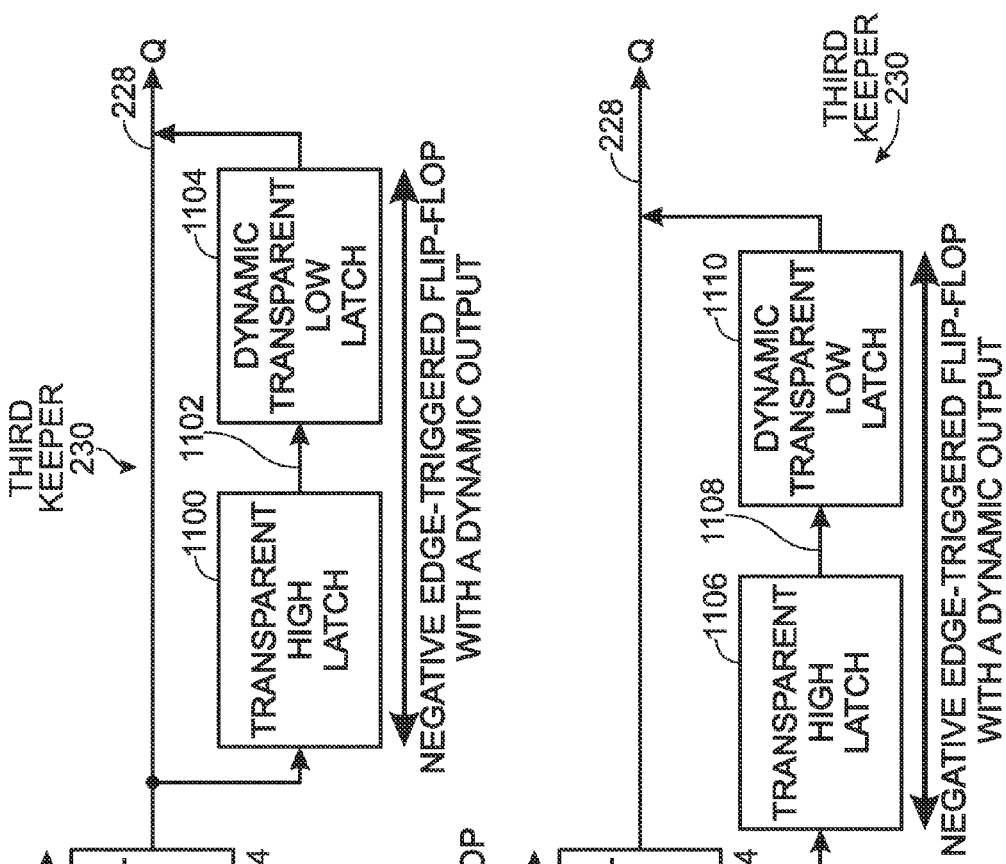

PSEUDO SINGLE-PHASE FLIP-FLOP (PSP-FF)

RELATED APPLICATIONS

This application is a Continuation-in-Part (CIP) of a patent application entitled, HAZARD-FREE MINIMUM-LATENCY FLIP-FLOP (HFML-FF), invented by Alfred Yeung et al., Ser. No. 13/255,044, filed Sep. 2, 2011, which is incorporated herein by reference.

This application is a Continuation-in-Part (CIP) of a patent application entitled, SHADOW LATCH, invented by Alfred Yeung et al., Ser. No. 13/077,949, filed Mar. 31, 2011, which is incorporated herein by reference.

This application is a CIP of a patent application entitled, PASS GATE SHADOW LATCH, invented by Hamid Partovi et al., Ser. No. 13/160,569, filed Jun. 15, 2011, which is incorporated herein by reference.

BACKGROUND OF THE INVENTION

1. Field of the Invention

This invention generally relates to electronic circuitry and, more particularly, to a pseudo single-phase flip-flop (PSP-FF) circuit.

2. Description of the Related Art

Terms:
true single-phase clocking (TSPC);
setup time (tsu);
clock-to-Q delay (tcq);
hold time (tiH);
data-to-Q delay (tDo).

Master-slave, pulsed, and TSPC-based flip-flops are known in the art. None, with the exception of the last, can incorporate complex logic (logic operations typically associated with combinational logic circuits) so as to increase the amount of work accomplished in one period of the clock cycle.

FIG. 1 is a schematic depicting a positive edge-triggered TSPC flip-flop (prior art). The TSPC flip-flop (TSPC-FF) has one of the lower latencies ($t_{DQ}=t_{SU}+t_{CQ}$), and more, it can incorporate complex logic, but suffers from a number of well-known structural problems which render it unsafe for large-scale use in commercial integrated circuits.

During the low phase of the clock, the flip-flop master is transparent. That is, changes at input D appear inverted on node mDb (the output). But since MN2, gated by the clock, is off, the transfer of mDb to the slave is blocked. DbMF is in pre-charge, and held at Vdd by MP2. Since DbMF is high, MP3, as well as the clock-gated MN3, is off. Q is in high impedance (floating) and holds state dynamically by the charge stored on its endemic capacitance and external load.

On the rising edge of the clock (CLK→Vdd), the master becomes opaque (the input is not transparent to the output) and enters "high-impedance". MP1 turns off, cutting off "mDb" from Vdd. However, as the pull down of the master is not clocked, mDb is allowed to transition low. It should however, hold beyond the clock rising edge for a period of time ($t_{H, D=0}$) sufficient for DbMF to fall.

As the master enters "high-impedance", the slave becomes transparent. Pre-charger MP2 turns off, and MN2 and MN3 turn on. If mDb is low, DbMF remains at Vdd but floats. If mDb is high, DbMF monotonically falls but can float low if D→1 after $t_{H, D=0}$ is satisfied.

In either case, the state of DbMF is inverted and transferred to the output Q. After a short time beyond the clock edge—characterized by ($t_{H, D=0}$), subsequent changes at D do not change the flip-flop state (mDb is cut off from Vdd).

During the high phase of the clock, Q is driven, but mDb and DbMF are in high impedance and hold their levels dynamically. Thus, to ensure a robust operation, keepers must be placed on the mDb and DbMF nodes.

Once the clock falls (CLK→0), DbMF is driven to Vdd and the clock-gated MN3 is turned off, placing Q in high impedance. Its state is dynamically held by the stored charge on endemic capacitance and output load. Coupling to, and leakage at this node can disturb its state. As opposed to the internal nodes of mDb and DbMF, a regenerative keeper placed at Q does not ensure robust operation as the state node of the slave (Q) remains exposed to external noise. The aforementioned operational characteristics of the circuit prove it to be a positive edge-triggered flip-flop. Some examples are keepers are presented below. Generally, a keeper is understood to be a circuit that maintains a logic state until it is charged or drained by adjacent connected circuitry.

The absence of keepers on the mDb, DbMF, and Q nodes, as well as the exposure of the state node to output disturbance are problems associated with the TSPC-FF design. Further, the design is sensitive to clock slope and internal race issues. On the falling edge of the clock, as the flip-flop master becomes transparent, the slave is turning opaque. Two race conditions relating to this transition can occur. A race between master and slave occurs if D=0 when clock falls and the clock-gated MP1 turns on. mDb transitions high, activating MN1. Concurrently, MN2 is turning off. For a sufficiently low clock edge rate, both transistors in the MN1/MN2 pull-down stack are on briefly, potentially disturbing DbMF when it has a logical value of "1".

An intra-slave race may occur if MP2 is large. That is, if DbMF pre-charges too quickly and activates MN4 before MN3 shuts off. A logical value of "1" at Q may be disturbed through the MN3/MN4 pull-down stack. Similarly, a sufficiently low clock slew may disturb the aforementioned level regardless of the size of MP2.

A $t_{CQ}$ imbalance may also occur between transitions. As DbMF is held at Vdd prior to the rising edge of the clock, there is a pronounced difference between $t_{CQ}$ 1→0 and $t_{CQ}$ 0→1 transitions. The latter must first discharge DbMF to ground. While the slower of the two transitions determines the latency of the flip-flop, the shorter $t_{CQ}$ places a more stringent limit on the minimum gate-delay budget between flip-flops so as to avoid race.

An output glitch may occur when data does not transition. Assume that D=0 in two consecutive cycles. On the rising edge of the first cycle, DbMF is discharged causing Q to transition to a logical "1". When the clock falls, DbMF is driven back to Vdd and Q holds state. On the rising edge of the next cycle, MN2 and MN3 come on. DbMF starts to discharge, but since MN4, gated by DbMF, is initially on, Q begins to discharge. Once DbMF is below the trip-point of the final stage, Q is returned to Vdd. Thus, the output exhibits a low-going glitch: Q 1→0→1 for D=0. Although this glitch is non-destructive, it causes additional power dissipation for downstream logic.

The design also creates a large clock load. True to its name, true single-phase clocking is devised so that the raw clock drives all three stages of the flip-flop (MP1, MN2, MP2, MN3) thus imposing a large load on the clock.

Timing Performance Metrics: Flip-flop latency is characterized by the data-to-Q delay which is the sum of its setup time, $t_{SU}$, to the rising clock edge and clock-to-Q delay, $t_{CQ}$, measured from the rising edge, i.e. $t_{DQ}=t_{SU}+t_{CQ}$. In the case of TSPC-FF, the 1→0 data transition produces the larger delay for both $t_{SU}$ and $t_{CQ}$. $t_{SU}$ is determined by the delay through the MP0/MP1 stack (mDb→1) and $t_{CQ}$ comprises the discharge of DbMF through MN1/MN2 stack summed with MP3 driving the output high. Therefore, it can be said that the TSPC-FF latency is about 3 gate delays.

The maximum flip-flop hold time, $t_H$, coupled with its minimum $t_{CQ}$ and clock skew, determines the minimum number of logic gates required between two flops to avoid hold time violation and race. The less positive the hold time, the easier it is for the logical effort to ensure a race-free operation. Maximum hold time for the TSPC-FF is the time required for the data to remain low after the rising edge of the clock so that mDb succeeds in discharging DbMF. This amounts to slightly larger than 1 gate delay.

It would be advantageous if a flip-flop design could be made faster than the TSPC flip-flop, and able to incorporate complex logic.

SUMMARY OF THE INVENTION

Accordingly, a pseudo single-phase flip-flop (PSP-FF) is provided with a master section and a slave section. The master section includes a pre-dissipation stage having an input to accept a D1 signal with a binary value, an input to accept a second clock signal (CK2) that is delayed but in phase with a base clock (CLK), and an output to supply a mDb signal with a binary value in a master pass mode, in response to D1 and CK2. A first keeper circuit is connected to the pre-dissipation stage output to maintain the mDb signal binary value during a master hold mode. The pre-dissipation stage discharges the first keeper to the mDb second binary value in response to the D1 first binary value, and selectively charges the first keeper with the mDb first binary value in the master pass mode.

The slave section includes a pre-charge stage having an input to accept the mDb signal, an input to accept CLK and CK2, and an output to charge a DbMF signal with a first binary value during a slave hold mode. A second keeper is connected to the pre-charge stage to maintain the DbMF first binary value in a slave pass mode when the mDb signal has a second binary value opposite in polarity to the first binary value. The second keeper supports a DbMF second binary value in the slave pass mode when the mDb signal has the first binary value. A post-dissipation stage has an input to accept the DbMF signal, an input to accept CK2, and an output to supply a Q signal with a binary value equal to an inverse of the DbMF binary value in a slave pass mode, in response to DbMF and CK2. A third keeper is connected to the post-dissipation stage to maintain the Q signal binary value during the slave hold mode.

More explicitly, the pre-dissipation stage selectively prevents the first keeper from charging to the mDb first binary value in response to the second phase of CK2. The post-dissipation stage is responsive to the second phase of CK2 in the slave pass mode.

Additional details of the above-described PSP-FF are provided below.

BRIEF DESCRIPTION OF THE DRAWINGS

FIG. 3 is a schematic depicting a first aspect of the pre-dissipation stage of FIG. 2 in greater detail.

FIG. 4 is a schematic diagram depicting a second aspect of the pre-dissipation stage of FIG. 2.

FIG. 5 is a schematic diagram depicting a third aspect of the pre-dissipation stage of FIG. 2.

FIG. 6 is a schematic diagram depicting the pre-charge stage and post-dissipation stage of FIG. 2, in detail.

FIG. 7 is a schematic diagram depicting an example of the third keeper of FIG. 11A.

FIGS. 11A and 11B are schematic block diagrams showing cascaded positive and negative edge flip-flops.

DETAILED DESCRIPTION

Figure 2:
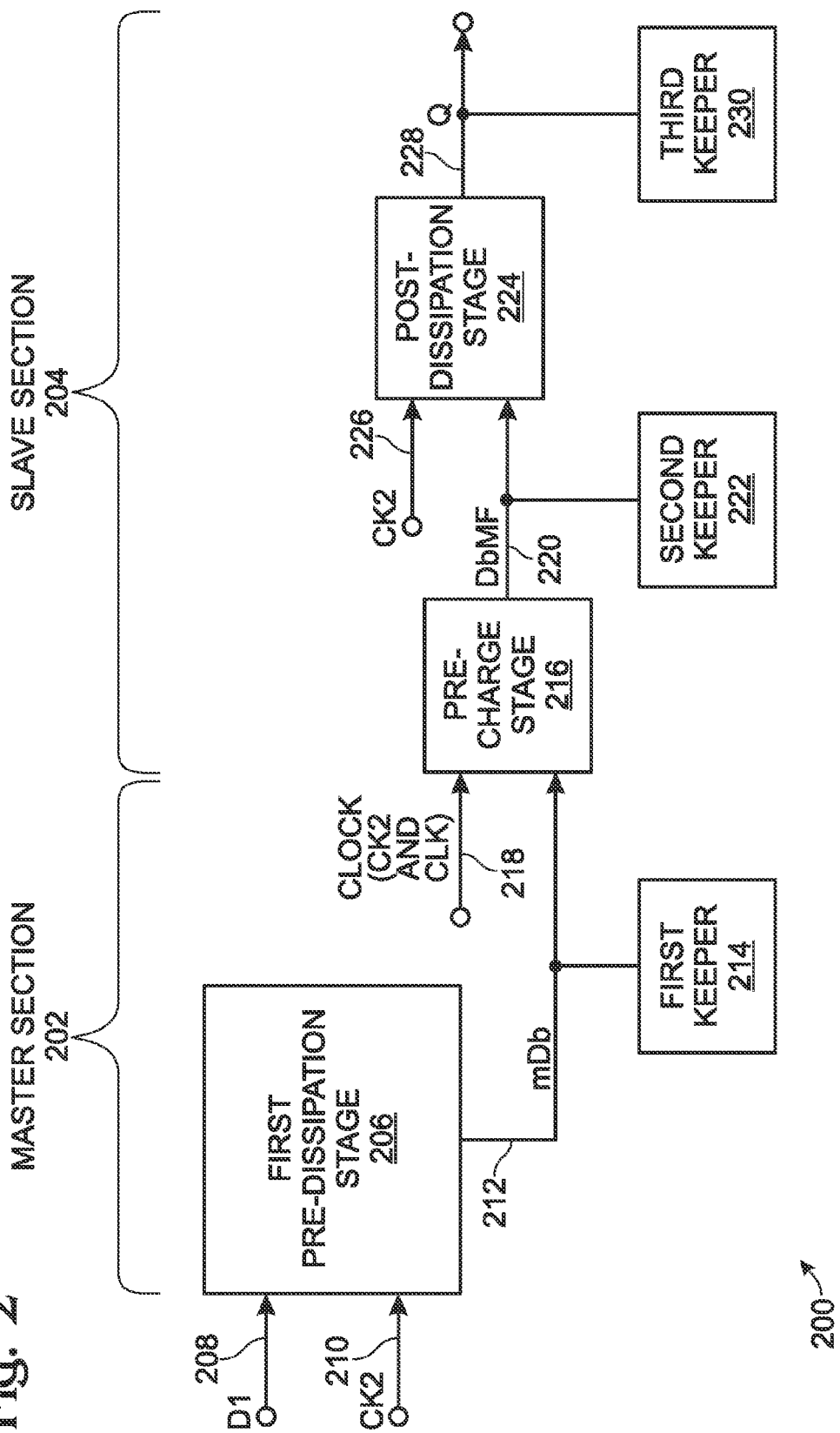
FIG. 2 is a schematic block diagram of a pseudo single-phase flip-flop (PSP-FF).

FIG. 2 is a schematic block diagram of a pseudo single-phase flip-flop (PSP-FF). The PSP-FF 200 comprises a master section 202 and a slave section 204. The master section 202 comprises a pre-dissipation stage 206 having an input on line 208 to accept a D1 signal with a binary value, an input on line 210 to accept a second clock (CK2), where CK2 has a second delay and is in phase with respect to a base clock signal (CLK). The pre-dissipation stage 206 has an output on line 212 to supply a mDb signal with a binary value in a master pass mode, in response to the D1 and CK2. A first keeper circuit 214 is connected to the first pre-dissipation stage output on line 212 to maintain the mDb signal binary value during a master hold mode.

The slave section 204 comprises a pre-charge stage 216 having an input on line 212 to accept the mDb signal, an input on line 218 to accept CLK and CK2, and an output on line 220 to charge a DbMF signal with a first binary value during a slave hold mode. A second keeper 222 is connected to the pre-charge stage on line 220 to maintain the DbMF first binary value in a slave pass mode when the mDb signal has a second binary value opposite in polarity to the first binary value. The second keeper 222 supports a DbMF second binary value in the slave pass mode when the mDb signal has the first binary value. In the examples below, the first binary value is "1" and the second binary value is "0". However, it should be understood that an equivalent version of PSP-FF may be enabled using the opposite polarity of values.

A post-dissipation stage 224 has an input on line 220 to accept the DbMF signal, an input on line 226 to accept CK2, and an output on line 228 to supply a Q signal with a binary value equal to an inverse of the DbMF binary value in a slave pass mode, in response to the DbMF and CK2. A third keeper 230 is connected to the second pre-dissipation stage output on line 228 to maintain the Q signal binary value during a slave hold mode.

The pre-charge stage 216 charges the second keeper 222 with the first binary value (e.g., "1") in response to a first phase (e.g., "0") of the base (CLK) and second (CK2) clocks, and dissipates the second keeper 222 to the second binary value ("0") in response to a combination of a second phase ("1") of the base clock and the mDb signal on line 212 having the first binary value ("1"). In the examples below, the first phase of the base clock CLK is defined as "0". However, equivalent versions of the PSP-FF may be enabled using the opposite polarity.

The pre-dissipation stage 206 discharges the first keeper 214 to the mDb second binary value in response to the D1 first binary value, and selectively charges the first keeper with the mDb first binary value in the master pass mode. More explicitly, the pre-dissipation stage 206, in the master hold mode, selectively prevents the first keeper 214 from charging to the mDb first binary value in response to the second phase of CK2. The post-dissipation stage 224, in the slave pass mode, is also responsive to the second phase of CK2.

FIG. 3 is a schematic depicting a first aspect of the pre-dissipation stage of FIG. 2 in greater detail. In this aspect, the pre-dissipation stage 206 is a clocked inverter that supplies the mDb first binary value ("1") in the master pass mode when D1 has the second binary value ("0"), and has a floating output in the master hold mode when D1 has the second binary value.

More explicitly, the pre-dissipation stage 206 comprises a first PMOS FET 300 having a first source/drain (S/D) connected to a first reference voltage on line 302, a gate connected to receive D1 on line 208, and a second S/D. A second PMOS FET 304 has a first S/D connected to the second S/D of the first PMOS FET 300, a gate to receive CK2 on line 210, and a second S/D connected to the first keeper on line 212. A first NMOS FET 306 has a first S/D connected to the first keeper on line 212, a gate connected to accept D1 on line 208, and a second S/D connected to a second reference voltage on line 308 having a lower potential than the first reference voltage. Alternatively but not shown, the NMOS devices may be replaced with PMOS FETs and vice versa, and the signals accordingly transposed, as would be well understood by one with skill in the art.

FIG. 4 is a schematic diagram depicting a second aspect of the pre-dissipation stage of FIG. 2. In this aspect the pre-dissipation stage 206 is a clocked NOR gate accepting a D0 signal on line 400 with a binary value and the D1 signal on line 208. The pre-dissipation stage 206 charges the first keeper to the mDb first binary value ("1") in the master pass mode when both D0 and D1 have the second binary value.

More explicitly, the pre-dissipation stage NOR gate comprises a first PMOS FET 402 having a first S/D connected to a first reference voltage on line 302, a gate connect to receive D0 on line 400, and a second S/D. A second PMOS FET 404 has a first S/D connected to the second S/D of the first PMOS FET 402, a gate connect to receive D1 on line 208, and a second S/D. A third PMOS FET 406 has a first S/D connected to the second S/D of the second PMOS FET 404. The third PMOS FET 406 has a gate to receive CK2 on line 210 and a second S/D connected to the first keeper on line 212.

A first NMOS FET 408 has a first S/D connected to the first keeper on line 212, a gate connected to accept D1 on line 208, and a second S/D connected to a second reference voltage on line 308 having a lower potential than the first reference voltage. A second NMOS FET 410 has a first S/D connected to the first keeper on line 212, a gate connected to accept D0 on line 400, and a second S/D connected to the second reference voltage on line 308.

FIG. 5 is a schematic diagram depicting a third aspect of the pre-dissipation stage of FIG. 2. In this aspect the pre-dissipation stage 206 is a clocked NAND gate accepting a D0 on line 500 with a binary value and the D1 signal on line 208. The pre-dissipation stage 206 charges the first keeper to the mDb first binary value ("1") on line 212 in the master pass mode when either of D0 or D1 have the second binary value ("0").

More explicitly, the first pre-dissipation stage NAND gate comprises a first PMOS FET 502 having a first S/D connected to a first reference voltage on line 302, a gate connect to receive D0 on line 500, and a second S/D. A second PMOS FET 504 has a first S/D connected to the first reference voltage on line 302, a gate connect to receive D1 on line 208, and a second S/D. A third PMOS FET 506 has a first S/D connected to the second S/D of the first and second PMOS FETs 502 and 504. The third PMOS FET 506 has a gate to receive CK2 on line 210 and a second S/D connected to the first keeper on line 212.

A first NMOS FET 508 has a first S/D connected to the first keeper on line 212, a gate connected to accept D1 on line 208, and a second S/D. A second NMOS FET 510 has a first S/D connected to the second S/D of the first NMOS FET 502, a gate connected to accept D0 on line 500, and a second S/D connected on line 308 to a second reference voltage having a lower potential than the first reference voltage.

Inverter, NOR, and NAND logic functions have been described above. One skilled in the art would be able to design a pre-dissipation stage with other combinational logic functions based upon the above-demonstrated principles.

FIG. 6 is a schematic diagram depicting the pre-charge stage and post-dissipation stage of FIG. 2, in detail. The pre-charge stage 216 comprises a fourth PMOS FET 600 having a first S/D connected to a first reference voltage on line 302, a gate connected to receive CLK on line 218a, and a second S/D. A fifth PMOS FET 602 has a first S/D connected to the second S/D of the fourth PMOS FET 600, a gate to receive CK2 on line 218b, and a second S/D connected to the second keeper 222 on line 220. A third NMOS FET 604 has a first S/D connected to the second keeper on line 220, a gate connected to the first keeper on line 212, and a second S/D. A fourth NMOS FET 606 has a first S/D connected to the second S/D of the third NMOS FET 604, a gate connected to accept CLK on 218a, and a second S/D connected to a second reference voltage on line 308 having a lower potential than the first reference voltage.

The post-dissipation stage 224 comprises a sixth PMOS FET 608 having a first S/D connected to the first reference voltage on line 302, a gate connected to the second keeper on line 220, and a second S/D connected to the third keeper 230 on line 228 to supply the Q signal in the slave pass mode. A fifth NMOS FET 610 has a first S/D connected to the second S/D of the sixth PMOS FET 608, a gate to receive CK2 on line 226, and a second S/D. A sixth NMOS FET 612 has a first S/D connected to second S/D of the fifth NMOS FET 610, a gate connected to the second keeper on line 220, and a second S/D connected to the second reference voltage on line 308.

FIGS. 11A and 11B are schematic block diagrams showing cascaded positive and negative edge flip-flops. In general, and as applied to all flip-flops, it can be said that a positive edge-triggered flip-flop can have an un-buffered dynamic output if it is coupled to a negative edge-triggered flip-flop whose input is driven either by the output of the master or the slave of the former.

In FIG. 11A the third keeper 230 may be enabled as a first latch 1100 having an input connected to the output of the post-dissipation stage 224 on line 228, and an output on line 1102 that is transparent with respect to the input (on line 228) in response to the second phase of CLK. A second latch 1104 has an input connected to the output of the first latch on line 1102, and an output on line 228 connected to supply the Q signal, which is transparent with respect to the input (on line 1102) in response to the first phase of CLK.

FIG. 7 is a schematic diagram depicting an example of the third keeper of FIG. 11A. The third keeper 230 first latch 1100 comprises a clocked pass gate circuit including a seventh PMOS FET 700 having a first S/D connected to the second S/D of the sixth PMOS FET on line 228, and a gate connected to receive CLK on line 702, and a second S/D to supply a QbM signal on line 704 with a binary value. A seventh NMOS FET 706 has a first S/D connected to the first S/D of the seventh PMOS FET 700, a second S/D connected to the second S/D of the seventh PMOS FET 700, and a gate to receive a first clock signal (CK1) on line 708 with a first delay and inverted in phase with respect to CLK. In one aspect, the first delay is less than the second delay associated with CK2.

The third keeper second latch 1104 comprises a NAND circuit 710 has a first input on line 704 to accept QbM, a second input to receive CK1 on line 702, and an output to supply a UP signal with a binary value on line 712. A NOR circuit 713 has a first input to accept QbM on line 704, a second input to accept CLK on line 702, and an output to supply a DN signal with a binary value on line 714.

An eighth PMOS FET 716 has a first S/D connected to the first reference voltage on line 302, a gate to accept the UP signal on line 712, and a second S/D to provide the QbM signal on line 704. An eighth NMOS FET 718 has a first S/D to provide the QbM signal on line 704, a gate to accept the DN signal on line 714, and a second S/D connected to the second reference voltage on line 308. A ninth PMOS FET 720 has a first S/D connected to the first reference voltage on line 302, a gate to accept the UP signal on line 712, and a second S/D to supply the Q signal on line 228 in the slave hold mode. A ninth NMOS FET 722 has a first S/D connected to the second S/D of the ninth PMOS FET 720, a gate to accept the DN signal on line 714, and a second S/D connected to the second reference voltage on line 308.

Returning to FIG. 11B, the third keeper 230 may be enabled as a first latch 1106 having an input connected to the output of the pre-charge stage 216 on line 220, and an output on line 1108 that is transparent with respect to the input (line 220) in response to the second phase of CLK. A second latch 1110 has an input connected to the output of the first latch on line 1108, and an output connected to supply the Q signal on line 228 that is transparent with respect to the input (line 1108) in response to the first phase of CLK.

Figure 17A:
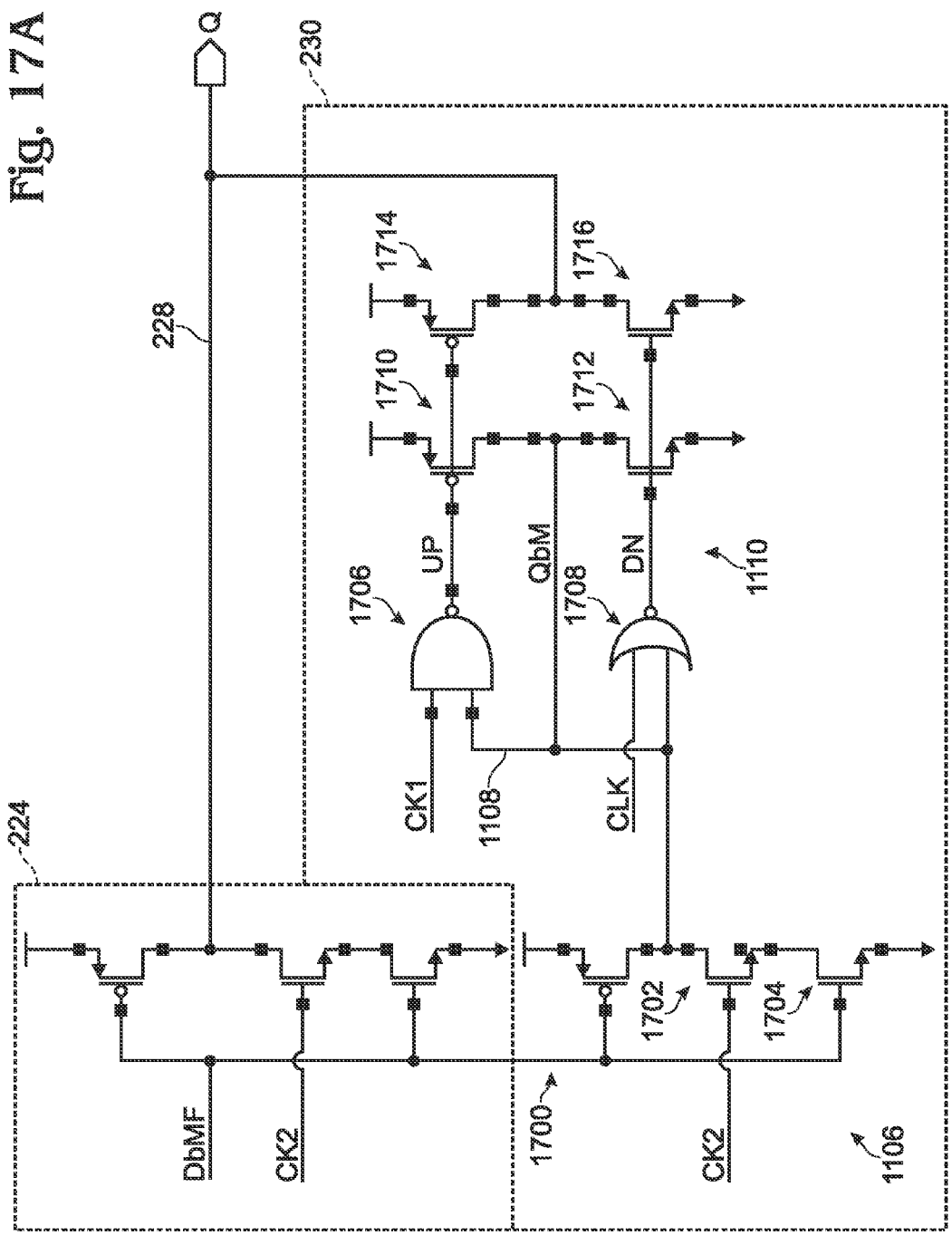
FIG. 17A is a schematic depicting the third keeper of FIG. 11B in greater detail.

FIG. 17A is a schematic depicting the third keeper of FIG. 11B in greater detail. The third keeper first latch 1106 comprises a seventh PMOS FET 1700 having a first S/D connected to the first reference voltage, a gate connected to accept DbMF, and a second S/D connected to supply a QbM signal on line 1108. A seventh NMOS FET 1702 has a first S/D connected to the second S/D of the seventh PMOS FET, a gate to receive CK2, and a second S/D. An eighth NMOS FET 1704 has a first S/D connected to second S/D of the seventh NMOS FET, a gate connected to accept DbMF, and a second S/D connected to the second reference voltage.

The third keeper second latch 1110 comprises a NAND circuit 1706 having a first input to accept QbM, a second input to receive CK1, and an output to supply a UP signal with a binary value. A NOR circuit 1708 has a first input to accept QbM, a second input to accept CLK, and an output to supply a DN signal with a binary value. An eighth PMOS FET 1710 has a first S/D connected to the first reference voltage, a gate to accept the UP signal, and a second S/D to provide the QbM signal. A ninth NMOS FET 1712 has a first S/D to provide the QbM signal, a gate to accept the DN signal, and a second S/D connected to the second reference voltage. A ninth PMOS FET 1714 has a first S/D connected to the first reference voltage, a gate to accept the UP signal, and a second S/D to supply the Q signal in the slave hold mode. A tenth NMOS FET 1716 has a first S/D connected to the second S/D of the ninth PMOS FET, a gate to accept the DN signal, and a second S/D connected to the second reference voltage.

Figure 1:
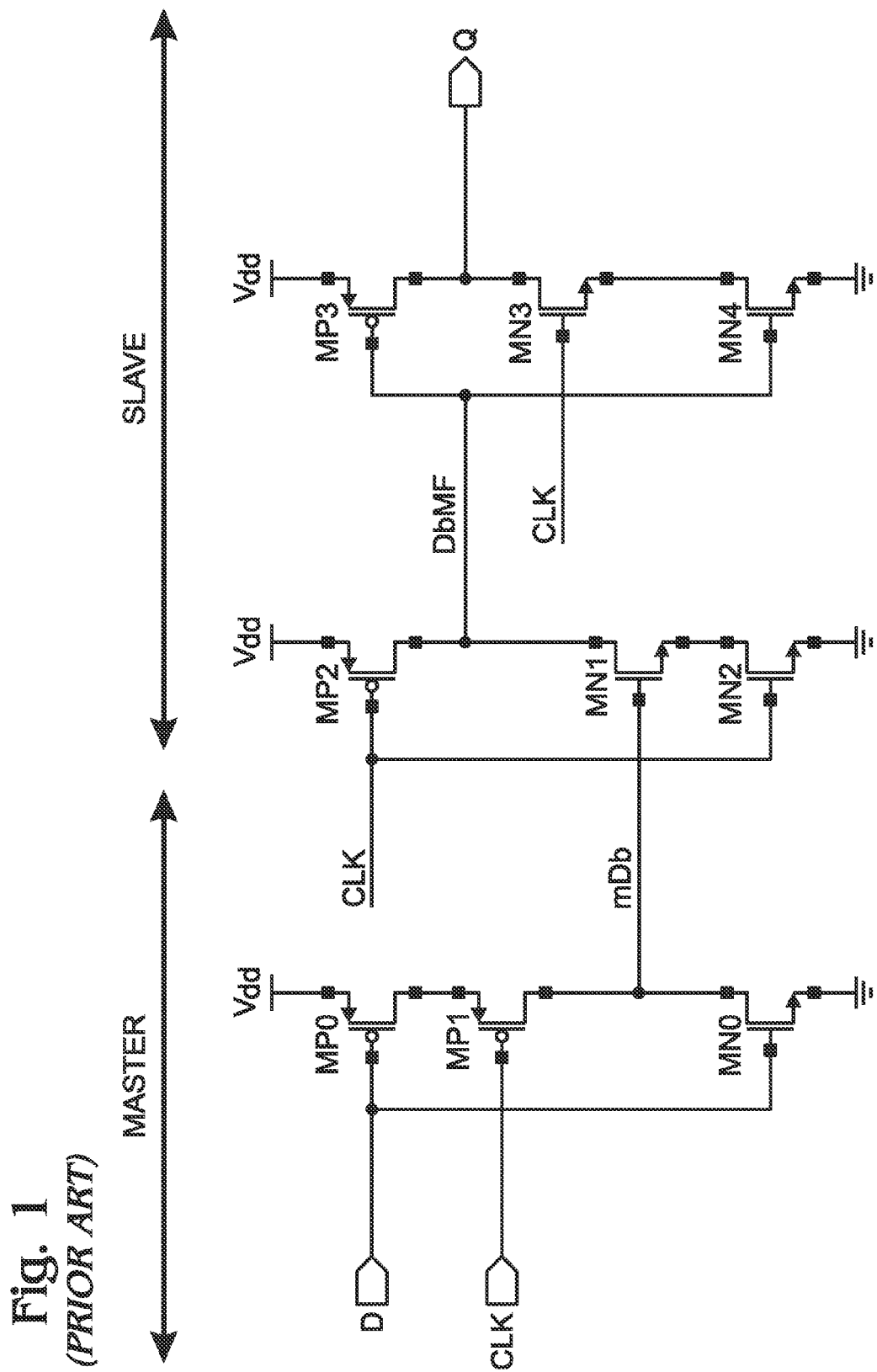
FIG. 1 is a schematic depicting a positive edge-triggered TSPC flip-flop (prior art).
Figure 8:
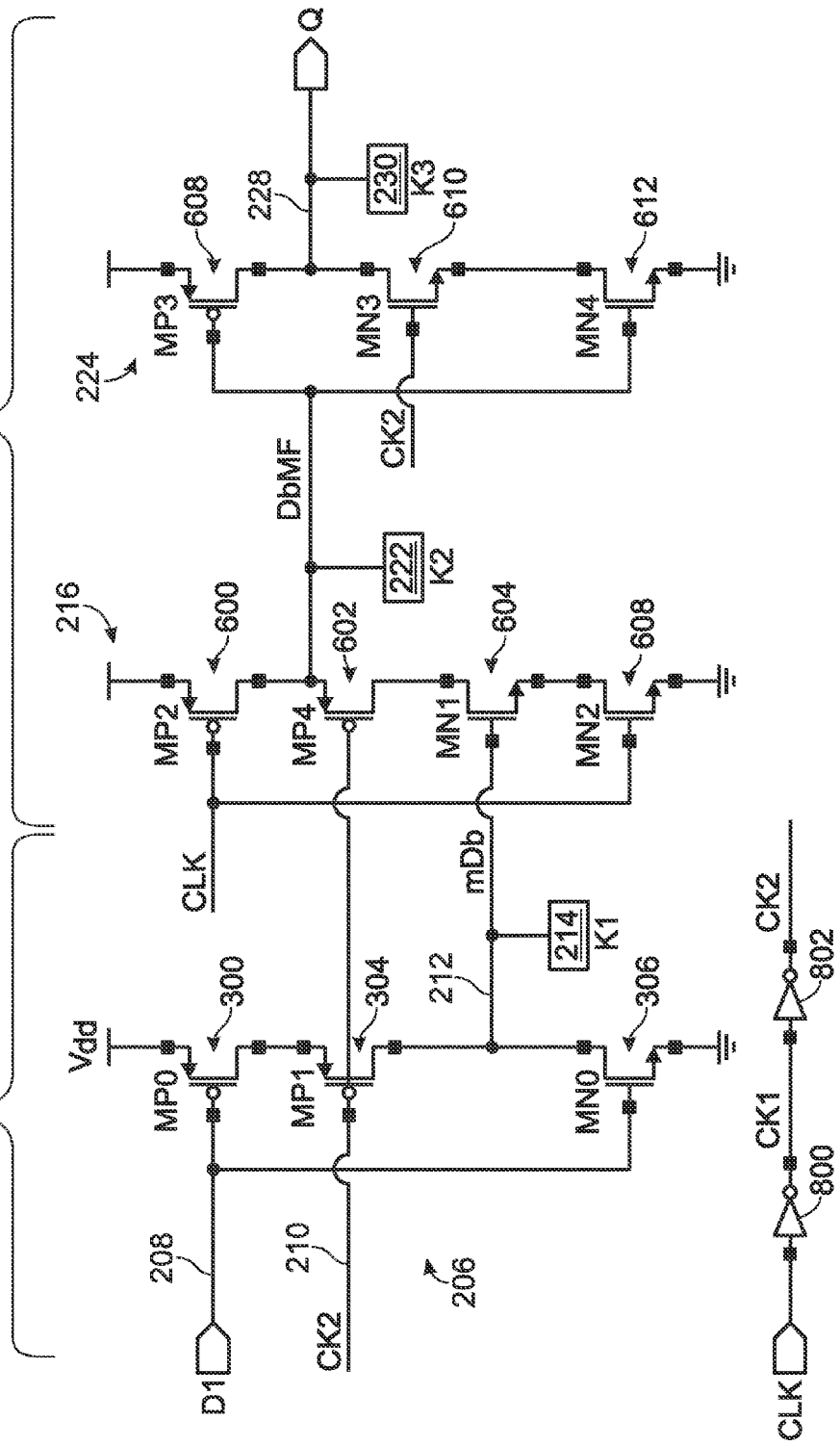
FIG. 8 is a schematic depicting a single-input positive edge-triggered flip-flop that incorporates features presented in FIGS. 3, 6, and 7.

FIG. 8 is a schematic depicting a single-input positive edge-triggered flip-flop that incorporates features presented in FIGS. 3, 6, and 7. Like the TSPC-FF of FIG. 1, it comprises 3 stages with keepers placed at each stage. Keepers K1 214 and K2 222 are conventional structures. K3 230 is a keeper which incorporates the state node of the slave, but is designed to isolate the latter from output disturbances, see FIG. 7.

Though a single-phase clock is globally distributed to all flip-flops, it may be internally inverted and buffered, using inverting buffers 800 and 802, in order to address the problems associated with the TSPC-FF. This flip-flop is called a pseudo single-phase flip-flop or PSP-FF.

As seen from the figure, the first and last stages of the flip-flop are the same as those of TSPC except that they are gated not by CLK, but a delayed clock CK2. The second stage 216, i.e. the first stage of the slave, is also similar to that of TSPC except for an additional PMOS transistor MP4 (602), gated by CK2, which is in series with MP2 (600).

The operation of PSP-FF is similar to that of TSPC-FF except for the following. The master does not become opaque on the rising edge of the clock but after two inversion delays, producing a soft boundary between the master and the slave. The master does not become transparent on the falling edge of the clock but after two inversion delays, thus solving the internal race. The slave does not become opaque on the falling clock edge but after two inversion delays. DbMF does not enter pre-charge till after CK2 falls and MP4 (602) turns on. The slave becomes transparent on the rising edge of the clock. MN2 608 turns on and MP2 600 turns off. However, the slave's stage 224 does not allow Q to transition low till after CK2 rises and MN3 610 turns on, thus equalizing clock-to-Q delay for both transitions. As demonstrated below, the PSP-FF is faster than the TSPC-FF, and addresses the aforementioned problems of the latter.

Figure 9B:
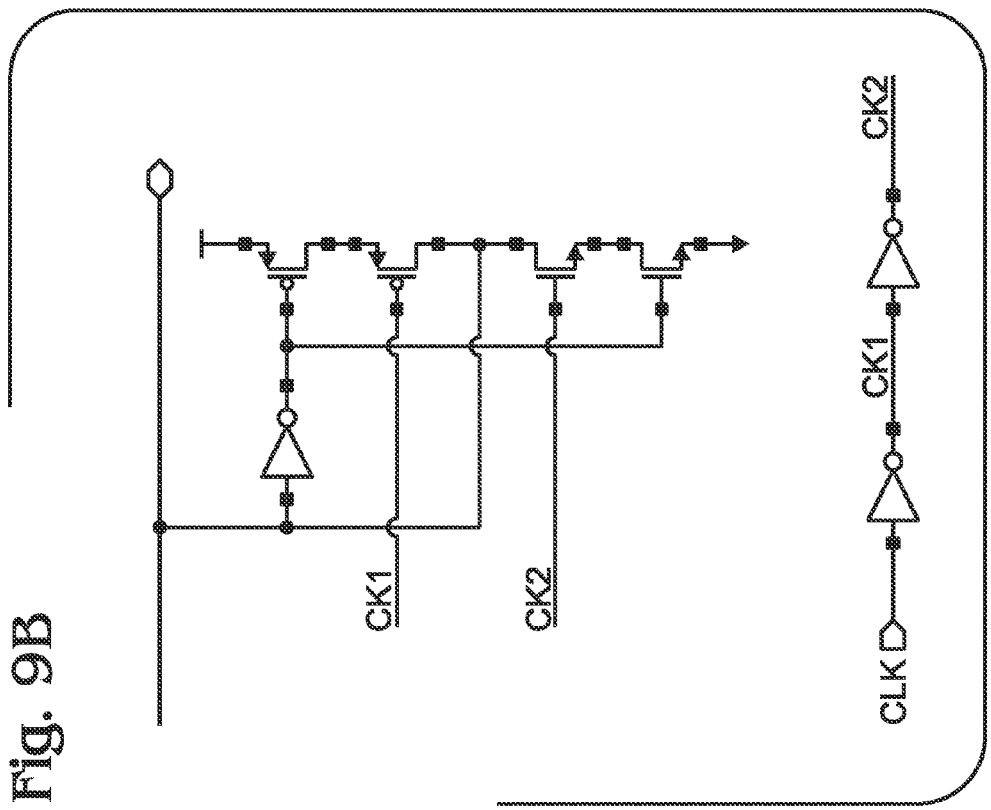
FIGS. 9A through 9C are schematic diagrams depicting variations of generic keepers suitable for use in the first and second stages of the PSP-FF, so as to eliminate "floating" or dynamic nodes.
Figure 9A:
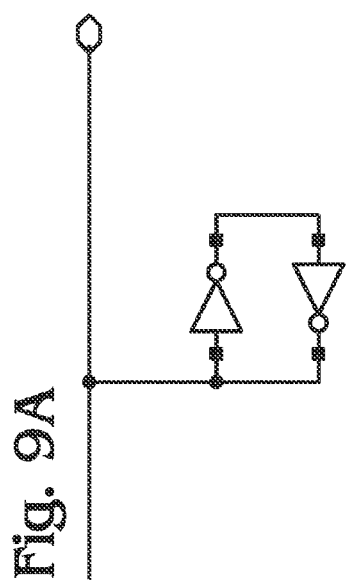
Figure 9C:
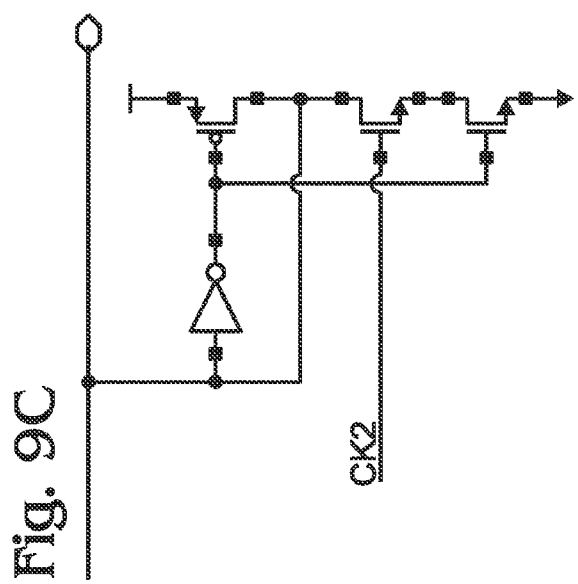

FIGS. 9A through 9C are schematic diagrams depicting variations of generic keepers suitable for use in the first and second stages of the PSP-FF, so as to eliminate "floating" or dynamic nodes. The keeper of FIG. 9A is non-clocked and thus the feedback inverter must be sufficiently small so that its state may be overridden. The keeper of FIG. 9B is fully clocked, and the keeper of FIG. 9C is partially-clocked. Clocked keepers favor weakly driven nodes.

As an example of usage, the PSP-FF master 202 of FIG. 8 comprises the PMOS pull-up stack of MP0/MP1 (300/304). It is desirable to have the first keeper K1 (214) pull-down disabled (clocked as in FIG. 9C) when the master is transparent and evaluating. This allows the master pull-up stack to be sized without any limitation imposed by the keeper pull-down.

In contrast to K1 214, which is needed to hold state at mDb when the master is opaque, K2 222 is necessary when the slave is transparent. K2 222 can be implemented as any of the keepers of FIGS. 9A-9C. If mDb is low when clock rises, DbMF stays high and held by the keeper pull-up. The keeper pull-down is needed because the master pull-down is not clocked and, thus, mDb can transition low after the flip-flop hold-time is met, leaving DbMF at a high-impedance, dynamic low-state. The keeper of FIG. 9C is preferred over the keeper of FIG. 9A as its pull-down is turned off when clock falls facilitating the pre-charge of DbMF.

Figure 10A:
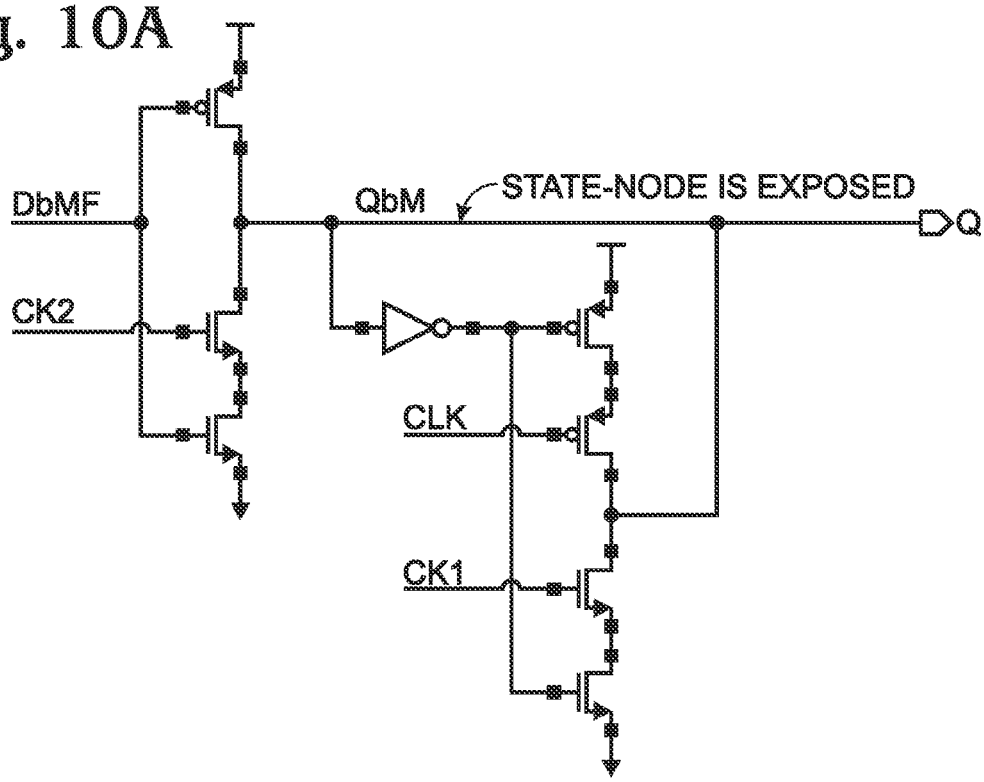
FIGS. 10A through 10D are schematic drawings depicting examples of the exposed and isolated state-nodes using the PSP-FF slave stage.

FIGS. 10A through 10D are schematic drawings depicting examples of the exposed and isolated state-nodes using the PSP-FF slave stage. The conventional flip-flops provided by standard-cell library vendors, as well as the flip-flops used by key processor design houses, never expose the state node to the external environment. FIG. 10A depicts an example of an exposed state node. During the low phase of the clock, the slave is opaque, and the clocked keeper K3 drives Q. Depending on its state, high-down (Q=1) or low-up (Q=0), coupling to this node can alter its state due to the regenerative action of the keeper. Therefore, incurring a penalty of 20 to 30% in latency, the state-node is buffered, an example of which is shown for the PSP-FF slave in FIG. 10B.

Figure 10B:
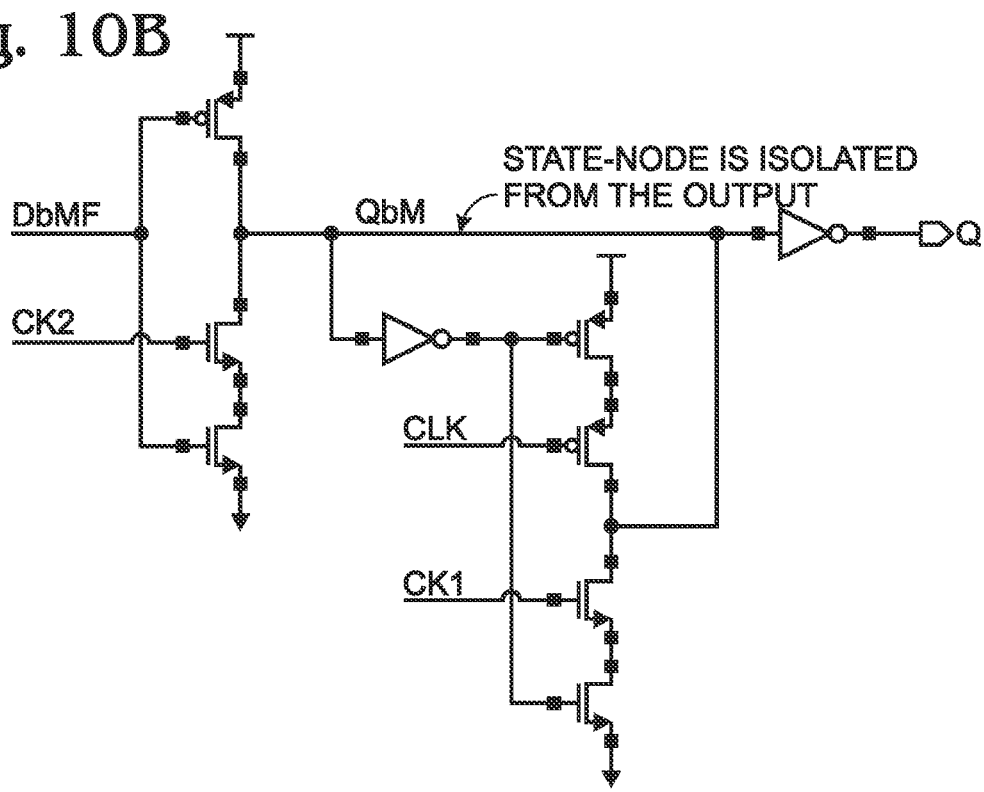
Figure 10C:
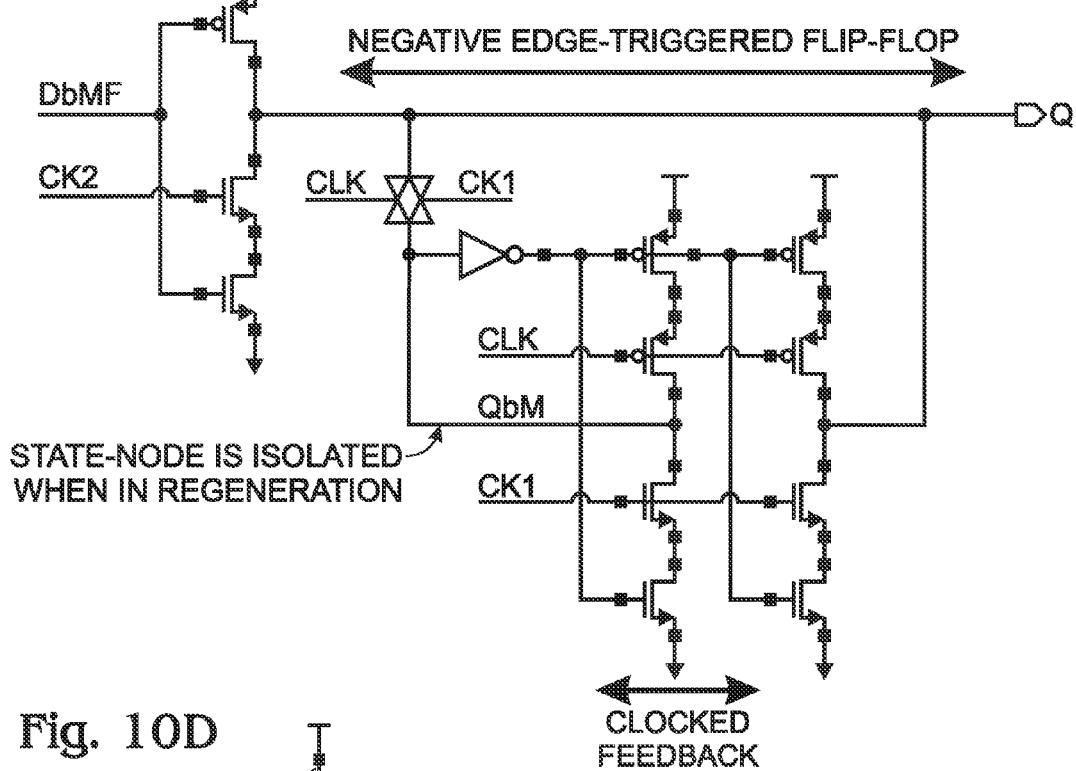
Figure 10D:
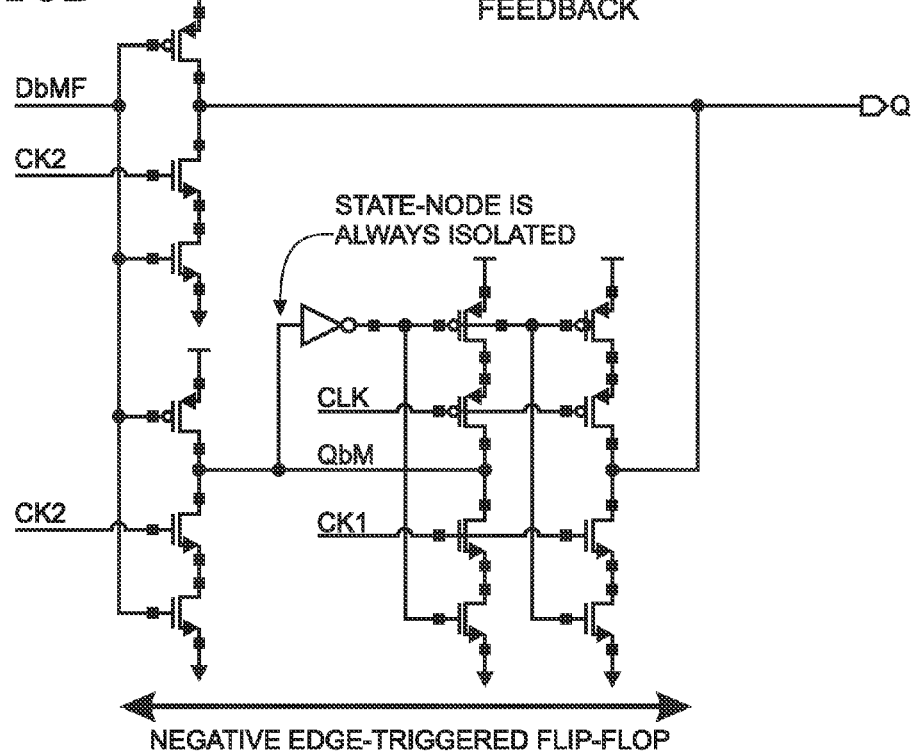

FIG. 10C illustrates the inclusion of an additional pass-gate and a clocked feedback while stripping the buffer required in FIG. 10B. The former isolates the state-node during the low phase of the clock when the keeper is driving Q. A cursory observation of the isolated keeper proves it to be a negative edge-triggered flip-flop with a dynamic output. FIG. 10D shows a slightly different variation of the isolated keeper, named as shadow keeper. It can be seen that the keeper is functionally a negative edge-triggered flip-flop with a dynamic output.

While in FIG. 10C the keeper input and output are tied together at Q, the shadow keeper (FIG. 10D) is driven by the previous stage, DbMF, which makes its state-node isolated from the output in both clock phases. Though the shadow keeper maybe slightly safer than FIG. 10C, its respective flip-flop is somewhat slower, as its input loads DbMF as opposed to the input loading Q of FIG. 10C.

It should be noted that the driving ability of the keepers of FIGS. 10C and 10D is compromised due to the transistor stacks at their outputs. One embodiment of the PSP-FF, as shown in FIG. 12 and described later, is implemented such that the keeper output comprises single—and not stacked—P and N transistors, thus eliminating the aforementioned drive strength problem.

Figure 12:
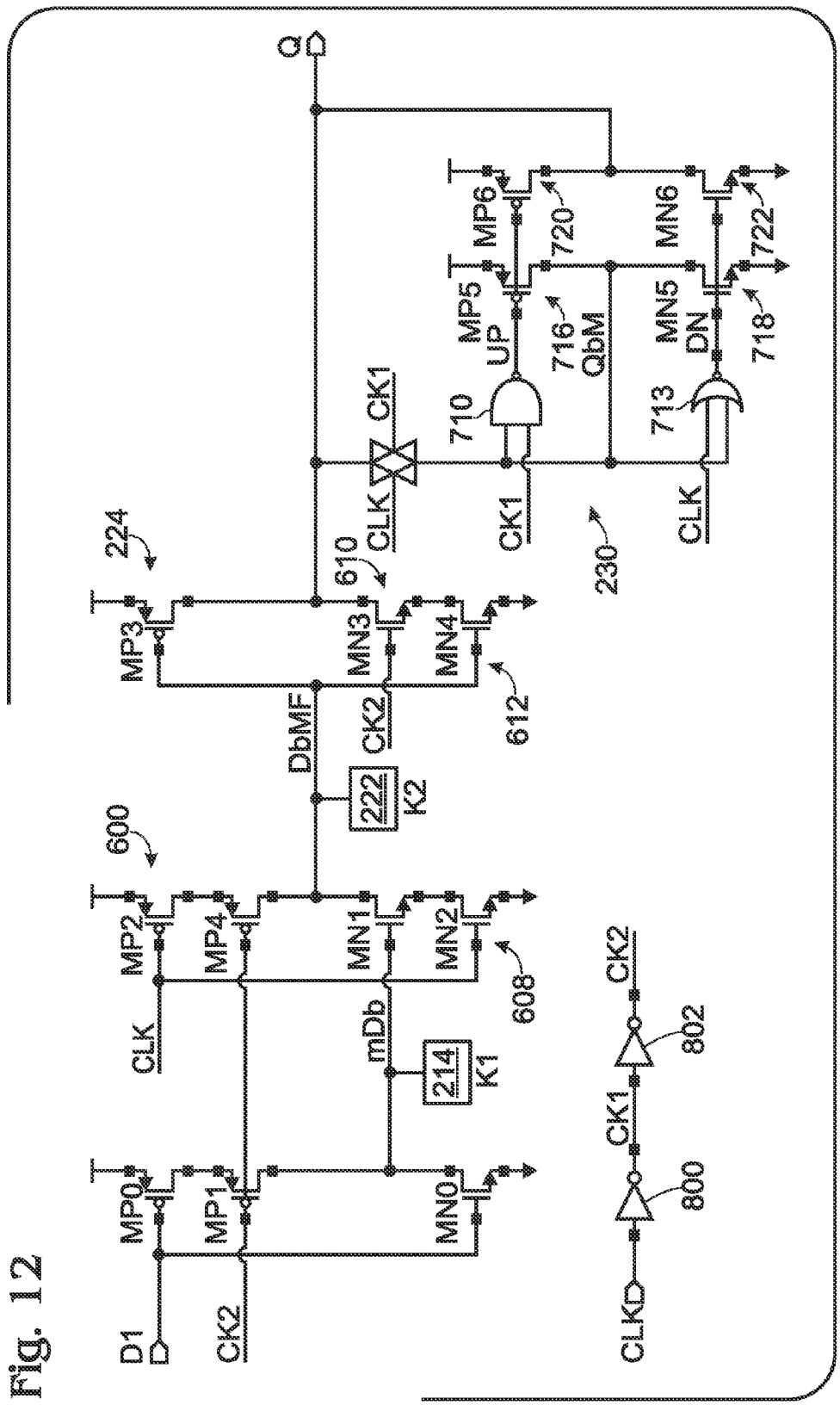
FIG. 12 is a schematic diagram illustrating the PSP-FF with an isolated output keeper.

FIG. 12 is a schematic diagram illustrating the PSP-FF with an isolated output keeper. It can be shown that Q is driven hard in both clock phases, and is at no time, even briefly, in high impedance. Further, the state node QbM is driven when the clock is high, and decoupled from the output when the clock is low and the keeper is regenerative. The keeper originates from, and ends at Q, and comprises a pass-gate followed by a tri-state buffer.

When clock is high, the flop slave is transparent and the pass-gate is enabled. Thus, both Q and QbM are driven hard by the slave. At the same time, the tri-state buffer with outputs Q and QbM is disabled (QP=1, QN=0). When clock falls, both the slave and the pass-gate become opaque. Concurrently, the tri-state buffer is activated. If QbM is sampled as a "1" on the falling clock edge, the NAND 710 discharges UP to ground turning transistors MP5 (716) and MP6 (720) on. If QbM is sampled as a "0", the NOR 713 drives DN to Vdd turning transistors MN5 (718) and MN6 (722) on.

In both cases, transistors MP6 (720) and MN6 (722), which form the keeper output, drive the same logical value throughout the low phase that was being driven by the slave in the high-phase of the clock. At the same time, the NAND 710 and NOR 713 gates, together with MP5 (716) and MN5 (718), form a regenerative feedback holding QbM at the level sampled on the falling clock edge.

Figure 13:
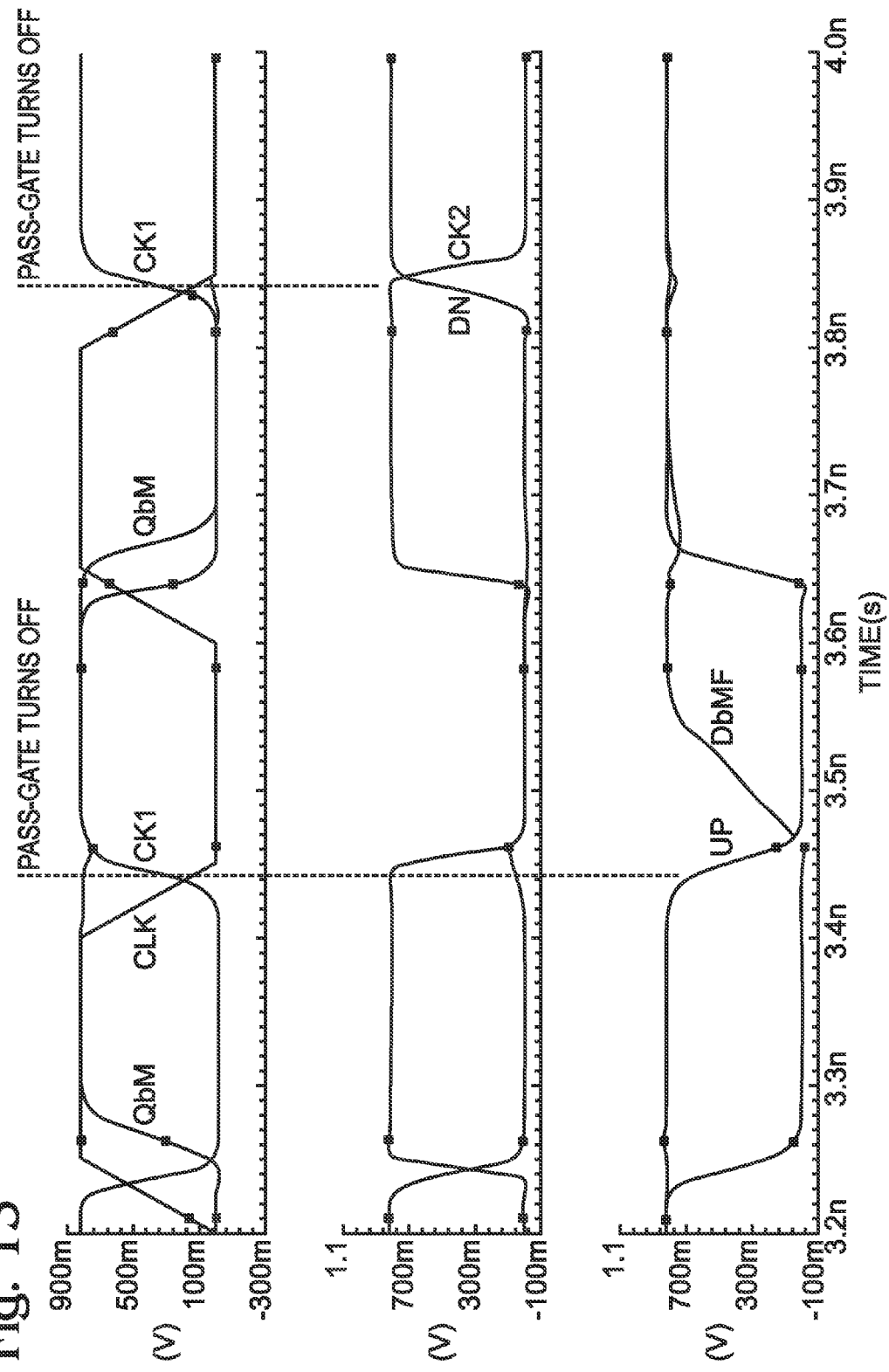
FIG. 13 shows the waveforms controlling the flip-flop slave (DbMF, CK2) and the keeper output (QP, QN).

FIG. 13 shows the waveforms controlling the flip-flop slave (DbMF, CK2) and the keeper output (UP, DN). As seen, on the falling edge of the clock, and depending on the data, UP falls before DbMF rises, or DN rises before CK2 falls, ensuring sufficient overlap between driving circuits, slave and keeper, on the falling edge of the clock. In summary, Q is driven hard throughout the full clock cycle. Furthermore, the pass-gate at the input of the keeper turns off before the slave becomes opaque, and the keeper is held regeneratively when it is its turn to drive Q.

On the falling edge of the clock MN2, gated by CLK, turns off before MP1, gated by the buffered clock, CK2, turns on, eliminating the race between the master and the slave. Responsive to CLK, CK2 falls and DbMF is pre-charged to Vdd turning MN4 on. Concurrently, MN3 turns off. Unlike the TSPC-FF of FIG. 1, which is sensitive to the raw clock falling edge causing a race between the two stages of the slave, CK2, internal to the PSP-FF has a controlled slew rate, eliminating the brief moment in time where both MN3 (610, see FIG. 12) and MN4 (612, FIG. 12) are both on.

Output transitions with respect to the rising edge of the clock, $t_{CQ}$ 1→0 and $t_{CQ}$ 0→1 are equalized to roughly 2 inversion delays as the transition for the former commences only after CK2 rises. For the same reason, with D1=0 for consecutive cycles, Q remains high and does not exhibit a low-going glitch.

Figure 14:
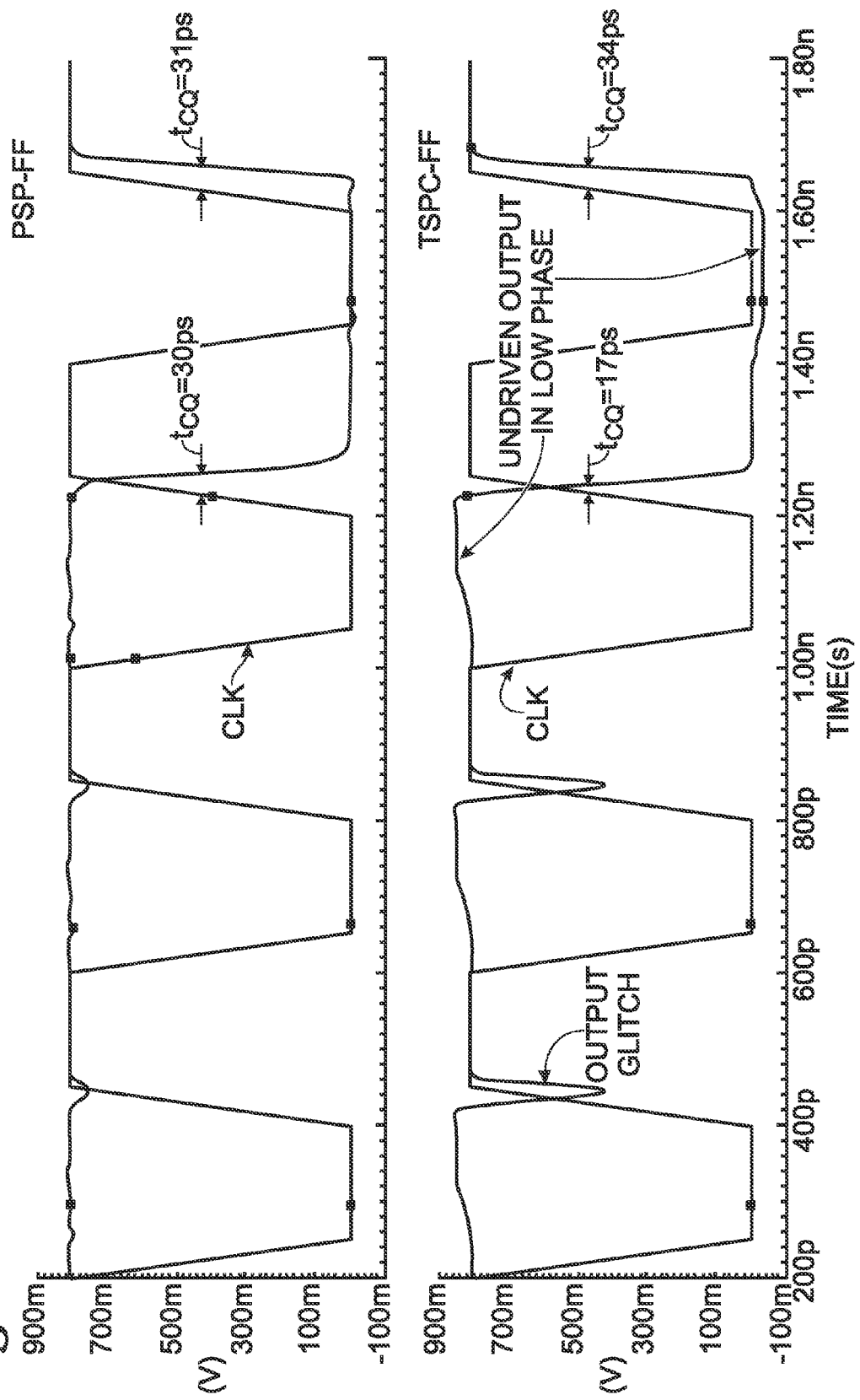
FIG. 14 shows a comparison of the clock-to-Q delays for the TSPC-FF and PSP-FF, for the 1→0, 0→1, and 1→1 output transitions.

FIG. 14 shows a comparison of the clock-to-Q delays for the TSPC-FF and PSP-FF, for the 1→0, 0→1, and 1→1 output transitions.

The $t_{CQ}$ imbalance (17 ps vs. 34 ps) exhibited by the former is absent in the latter (30 ps vs. 31 ps), and so is the pronounced output glitch for the 1→1 output transition, as well as, the high-up and low-down excursions of the "floating" output in the low-phase.

In the case of TSPC-FF, the raw clock CLK drives MP1, MP2, MN2, and MN3 transistors. Except for the pre-charger MP2 (600, FIG. 12), these devices can be quite large so as to satisfy low latency, as well as an acceptable output edge rate. But for the PSP-FF, CLK only drives MP2 (600, FIG. 12) and MN2 (608, FIG. 12). Further, CLK may optionally drive a small inverter (800, FIG. 12) for generating the buffered clock variants, CK1 and CK2. As a result, the latter flip-flop can provide better drive capability and higher speed when having a comparable clock load to those of the TSPC.

Figure 15:
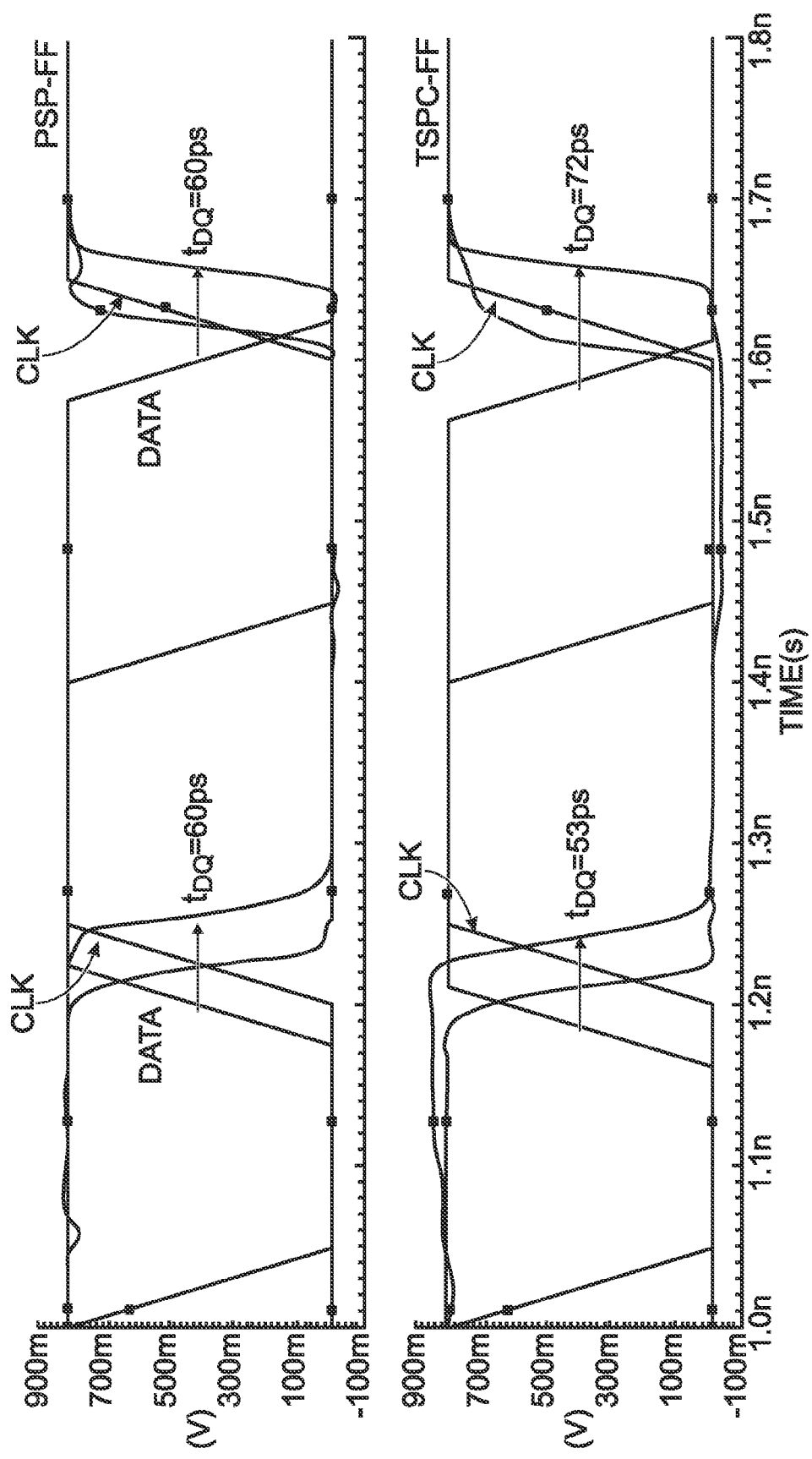
FIG. 15 is a timing diagram comparing PSP-FF and TSPC-FF delays.

FIG. 15 is a timing diagram comparing PSP-FF and TSPC-FF delays. While the worst-case $t_{CQ}$ delays are similar for both flip-flops, the PSP-FF has a much shorter $t_{SU}$ for the following reason. The boundary between its master and slave on the rising edge of the clock is soft, i.e. when the slave is activated, the master is still transparent and becomes opaque only after CK2 rises. In contrast, such a boundary for TSPC is hard, i.e. the master becomes opaque on the rising edge of CLK. Thus, data must rigidly set up to the rising clock edge. Therefore, the PSP-FF $t_{DQ}$ delay is faster than that for TSPC-FF by roughly 20%.

As described earlier, the maximum hold time for TSPC-FF relates to D1=0 which is about 1 gate delay and is the same for PSP-FF. However the soft edge of the latter produces a 2 gate-delay hold time requirement for D1=1. That is, data cannot transition low before CK2 rises. If it does, mDb rises and D=0 races through the flip-flop.

Figure 16:
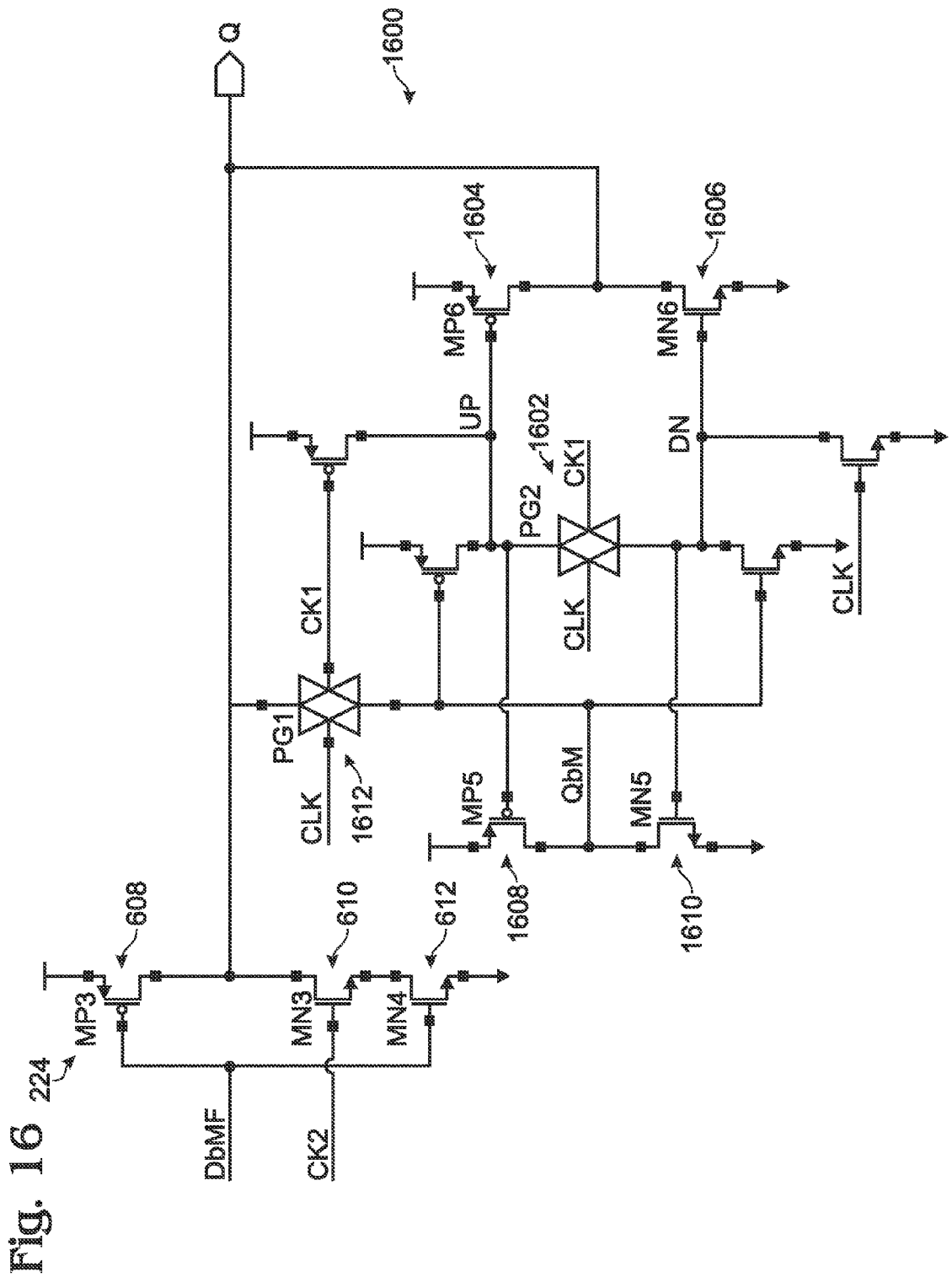
FIG. 16 illustrates another variation of isolated keeper.

FIG. 16 illustrates another variation of isolated keeper 1600. As compared to the keeper of FIG. 12, the tri-state buffer uses a different topology that is more compact. The following gives a brief description of its operation. During the high phase of the clock (CLK=1, CK1=0, CK2=1), the flip-flop slave is driving Q and QbM (PG1 1612 is on), at the same time, PG2 1602 is off. UP and DN are at VDD and ground respectively. Thus, the keeper driver comprising MP6/MN6 (1604/1606), as well as the keeper feedback MP5/MN5 (1608/1610) is off.

On the falling edge of the clock, PG1 turns off, and PG2 turns on allowing the transfer of the inverted value of QbM to nodes UP and DN. In response, the keeper output turns on and on the falling edge of CK2 the slave turns off. Thus, although, both the slave and the keeper outputs are dynamically driven when separated on alternate clock phases, together, there common output is always driven.

Figure 17B:
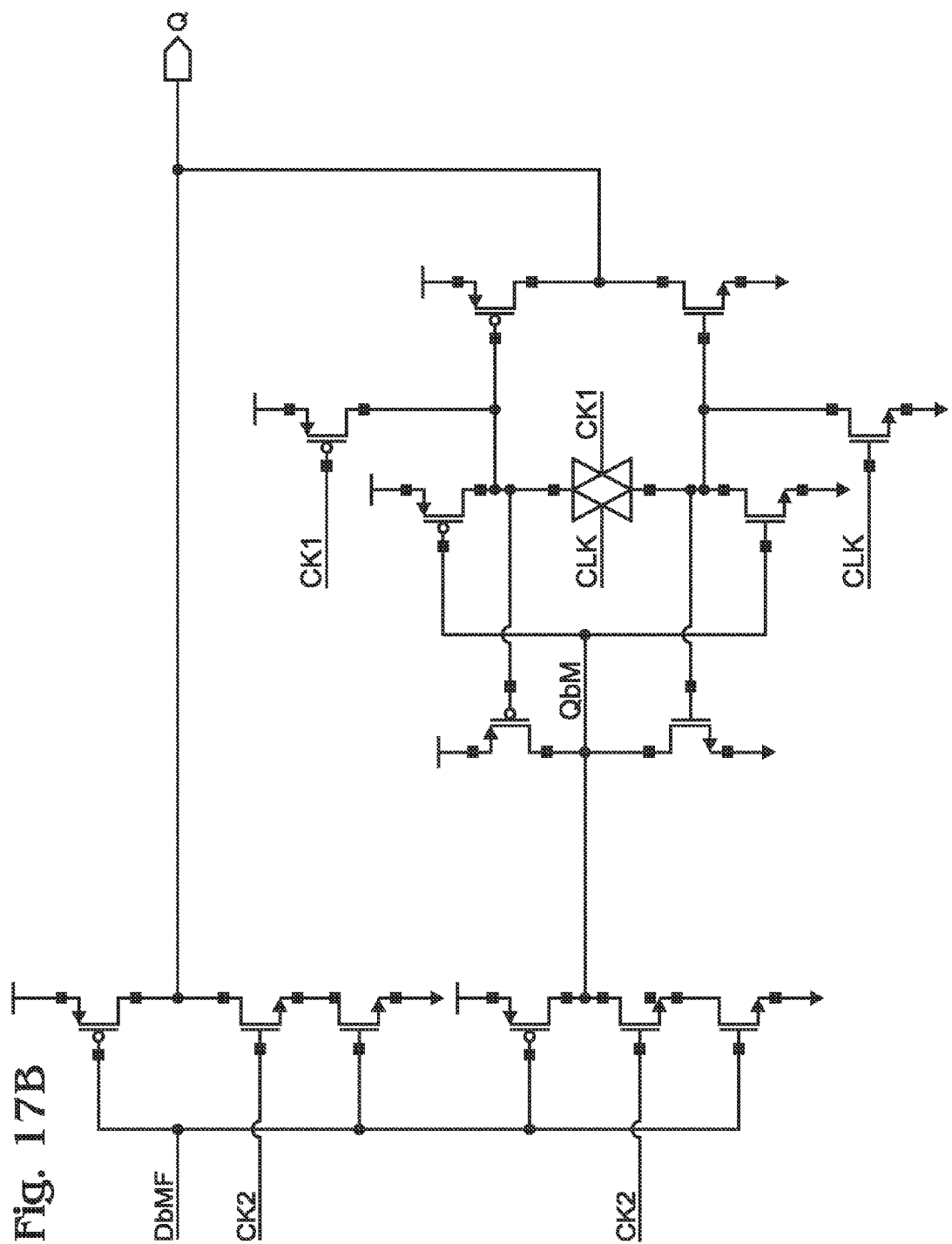
FIG. 17B depicts another variation of an isolated third keeper.

FIG. 17B depicts another variation of an isolated third keeper. The shadow latch concept was initially presented in a patent application entitled, SHADOW LATCH, invented by Alfred Yeung et al., Ser. No. 13/077,949, filed Mar. 31, 2011.

Figure 18:
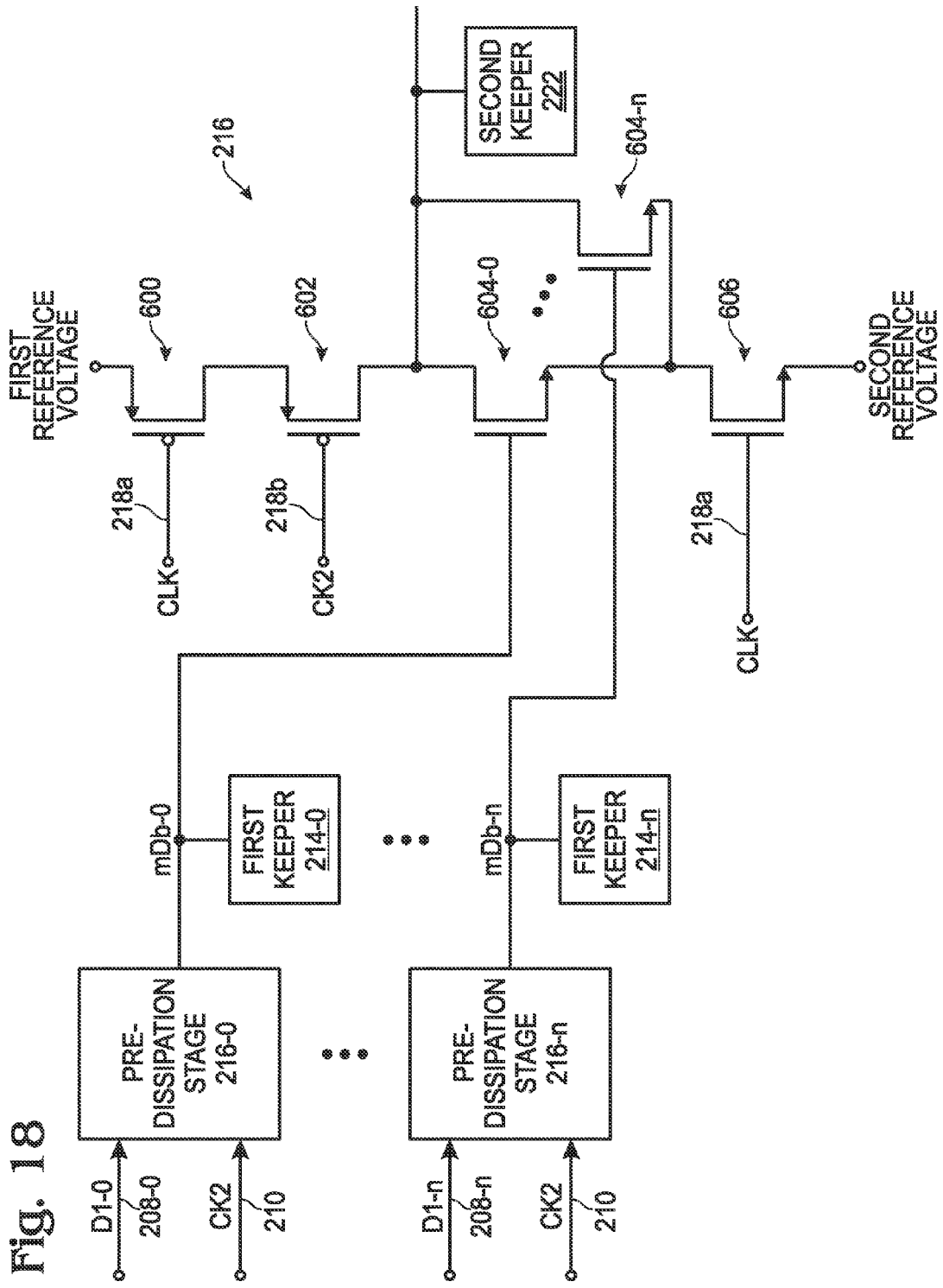
FIG. 18 is schematic block diagram depicting the PSP-FF enabled as a multiplexer (MUX) device.

FIG. 18 is schematic block diagram depicting the PSP-FF enabled as a multiplexer (MUX) device. Shown are a plurality of n pre-dissipation stages 206-0 through 206-*n*, supplying corresponding signals mDb0 through mDbn. Note: n is not limited to any particular value. A plurality of n first keepers 214-0 through 214-*n* is shown, each connected to a corresponding pre-dissipation stage. In this aspect, the pre-charge stage 216 comprises a plurality of n third NMOS FETs 604-0 through 604-*n*, each third NMOS FET having a first S/D connected to the second keeper 212, a gate connected to a corresponding first keeper, and a S/D connected to the first S/D of the fourth NMOS FET 606.

The PSP-FF can incorporate complex logic at virtually no impact to its latency because of its un-buffered output, thanks to the isolated keeper, and the monotonic nature of its slave stage. Assorted logic and routing wires can safely be placed directly at the Q output in place of a buffer which would have otherwise been necessary to protect the storage node.

As shown, logic can be integrated with a plurality of single-delay masters driving a plurality of NMOS pull-down transistors on the monotonic node of the slave, as shown. The PSP-FF shown is a n:1 MUX. The MUX can be implemented with a variety of pre-dissipation logic functions (e.g., NAND and NOR). Unlike pass-gate style MUX circuits, mutual exclusivity of select signals is not required to avoid contention and circuit damage.

A PSP-FF has been presented with keeper variations and input logic function variations. Examples of positive edge-triggered designs have been presented to illustrate the invention. However, the invention is not limited to merely these examples. Other variations and embodiments of the invention will occur to those skilled in the art.

We claim:

1. A pseudo single-phase flip-flop (PSP-FF) comprising:
a master section comprising:
   a pre-dissipation stage having an input to accept a D1 signal with a binary value, an input to accept a second clock (CK2) that has a second delay, and is in phase with respect to a base clock signal (CLK), and an output to supply a mDb signal with a binary value in a master pass mode, in response to the D1 and CK2;
   a first keeper circuit connected to the pre-dissipation stage output to maintain the mDb signal binary value during a master hold mode;
a slave section comprising:
   a pre-charge stage having an input to accept the mDb signal, an input to accept CLK and CK2, and an output to charge a DbMF signal with a first binary value during a slave hold mode;
   a second keeper connected to the pre-charge stage to maintain the DbMF first binary value in a slave pass mode when the mDb signal has a second binary value opposite in polarity to the first binary value, and to support a DbMF second binary value in the slave pass mode when the mDb signal has the first binary value;
   a post-dissipation stage having an input to accept the DbMF signal, an input to accept CK2, and an output to supply a Q signal with a binary value equal to an inverse of the DbMF binary value in the slave pass mode, in response to the DbMF and CK2;
   a third keeper connected to the post-dissipation stage to maintain the Q signal binary value during the slave hold mode and,
wherein the pre-charge stage charges the second keeper with the first binary value in response to a first phase of the base and second clocks, and dissipates the second keeper to the second binary value in response to a combination of a second phase of the base clock and the mDb first binary value; and
the pre-dissipation stage discharges the first keeper to the mDb second binary value in response to the D1 first binary value, and selectively charges the first keeper to the mDb first binary value in the master pass mode, and the pre-dissipation stage is a clocked inverter that supplies the mDb first binary value in the master pass mode when D1 has the second binary value, and has a floating output in the master hold mode when D1 has the second binary value.

2. The PSP-FF of claim 1 wherein the pre-dissipation stage comprises:
   a first PMOS FET having a first source/drain (S/D) connected to a first reference voltage, a gate connected to receive D1, and a second S/D;
   a second PMOS FET having a first S/D connected to the second S/D of the first PMOS FET, a gate to receive CK2, and a second S/D connected to the first keeper; and,
   a first NMOS FET having a first S/D connected to the first keeper, a gate connected to accent D1, and a second S/D connected to a second reference voltage having a lower potential than the first reference voltage.

3. A pseudo single-phase flip-flop (PSP-FF) comprising:
a master section comprising:
   a pre-dissipation stage having an input to accept a D1 signal with a binary value, an input to accept a second clock (CK2) that has a second delay, and is in phase with respect to a base clock signal (CLK), and an output to supply a mDb signal with a binary value in a master pass mode, in response to the D1 and CK2;
   a first keeper circuit connected to the ore-dissipation stage output to maintain the mDb signal binary value during a master hold mode;
a slave section comprising:
   a pre-charge stage having an input to accept the mDb signal, an input to accept CLK and CK2, and an output to charge a DbMF signal with a first binary value during a slave hold mode;
   a second keeper connected to the pre-charge stage to maintain the DbMF first binary value in a slave pass mode when the mDb signal has a second binary value opposite in polarity to the first binary value, and to support a DbMF second binary value in the slave pass mode when the mDb signal has the first binary value;
   a post-dissipation stage having an input to accept the DbMF signal, an input to accept CK2, and an output to supply a Q signal with a binary value equal to an inverse of the DbMF binary value in the slave pass mode, in response to the DbMF and CK2;
a third keeper connected to the post-dissipation stage to maintain the Q signal binary value during the slave hold mode and,
wherein the pre-charge stage charges the second keeper with the first binary value in response to a first phase of the base and second clocks, and dissipates the second keeper to the second binary value in response to a combination of a second phase of the base clock and the mDb first binary value; and
the pre-dissipation stage in the master hold mode selectively prevents the first keeper from charging to the mDb first binary value in response to the second phase of CK2; and,
wherein the post-dissipation stage in the slave pass mode is responsive to the second phase of CK2.

4. The PSP-FF of claim 3 wherein the pre-dissipation stage is a clocked inverter that supplies the mDb first binary value in the master pass mode when D1 has the second binary value, and has a floating output in the master hold mode when D1 has the second binary value.

5. The PSP-FF of claim 3 wherein the pre-dissipation stage is a clocked NOR gate accepting a D0 signal with a binary value and the D1 signal, and charging the first keeper with the mDb first binary value in the master pass mode when both D0 and D1 have the second binary value.

6. The PSP-FF of claim 3 wherein the pre-dissipation stage is a clocked NAND gate accepting a D0 signal with a binary value and the D1 signal, and charging the first keeper to the mDb first binary value in the master pass mode when either of D0 or D1 have the second binary value.

7. The PSP-FF of claim 4 wherein the pre-dissipation stage comprises:
a first PMOS FET having a first source/drain (S/D) connected to a first reference voltage, a gate connected to receive D1, and a second S/D;
a second PMOS FET having a first S/D connected to the second S/D of the first PMOS FET, a gate to receive CK2, and a second S/D connected to the first keeper; and,
a first NMOS FET having a first S/D connected to the first keeper, a gate connected to accept D1, and a second S/D connected to a second reference voltage having a lower potential than the first reference voltage.

8. The PSP-FF of claim 5 wherein the pre-dissipation stage NOR gate comprises:
a first PMOS FET having a first S/D connected to a first reference voltage, a gate connected to receive D0, and a second S/D;
a second PMOS FET having a first S/D connected to the second S/D of the first PMOS FET, a gate connect to receive D1, and a second S/D;
a third PMOS FET having a first S/D connected to the second S/D of the second PMOS FET, the third PMOS FET having a gate to receive CK2 and a second S/D connected to the first keeper;
a first NMOS FET having a first S/D connected to the first keeper, a gate connected to accept D1, and a second S/D connected to a second reference voltage having a lower potential than the first reference voltage; and,
a second NMOS FET having a first S/D connected to the first keeper, a gate connected to accept D0, and a second S/D connected to the second reference voltage.

9. The PSP-FF of claim 6 wherein the pre-dissipation stage NAND gate comprises:

a first PMOS FET having a first S/D connected to a first reference voltage, a gate connected to receive D0, and a second S/D;
a second PMOS FET having a first S/D connected to the first reference voltage, a gate connect to receive D1, and a second S/D;
a third PMOS FET having a first S/D connected to the second S/D of the first and second PMOS FETs, the third PMOS FET having a gate to receive CK2 and a second S/D connected to the first keeper;
a first NMOS FET having a first S/D connected to the first keeper, a gate connected to accept D1, and a second S/D; and,
a second NMOS FET having a first S/D connected to the second S/D of the first NMOS FET, a gate connected to accept D0, and a second S/D connected to a second reference voltage having a lower potential than the first reference voltage.

10. The PSP-FF of claim 3 wherein the pre-charge stage comprises:
a fourth PMOS FET having a first S/D connected to a first reference voltage, a gate connected to receive CLK, and a second S/D;
a fifth PMOS FET having a first S/D connected to the second S/D of the fourth PMOS FET, a gate to receive CK2, and a second S/D connected to the second keeper;
a third NMOS FET having a first S/D connected to the second keeper, a gate connected to the first keeper, and a second S/D;
a fourth NMOS FET having a first S/D connected to the second S/D of the third NMOS FET, a gate connected to accept CLK, and a second S/D connected to a second reference voltage having a lower potential than the first reference voltage.

11. The PSP-FF of claim 10 wherein the post-dissipation stage comprises:
a sixth PMOS FET having a first S/D connected to the first reference voltage, a gate connect to the second keeper, and a second S/D connected to the third keeper to supply the Q signal in the slave pass mode;
a fifth NMOS FET having a first S/D connected to the second S/D of the sixth PMOS FET, a gate to receive CK2, and a second S/D; and,
a sixth NMOS FET having a first S/D connected to second S/D of the fifth NMOS FET a gate connected to the second keeper, and a second S/D connected to the second reference voltage.

12. The PSP-FF of claim 11 wherein the third keeper comprises:
a first latch having an input connected to the output of the post-dissipation stage, and an output that is transparent with respect to the input in response to the second phase of CLK; and,
a second latch with an input connected to the output of the first latch, and an output connected to supply the Q signal that is transparent with respect to the input in response to the first phase of CLK.

13. The PSP-FF of claim 12 wherein the third keeper first latch comprises:
a clocked pass gate circuit comprising:
a seventh PMOS FET having a first S/D connected to the second S/D of the sixth PMOS FET, and a gate connected to receive CLK, and a second S/D to supply a QbM signal with a binary value;
a seventh NMOS FET having a first S/D connected to the first S/D of the seventh PMOS FET, a second S/D connected to the second S/D of the seventh PMOS FET, and a gate to receive a first clock signal (CK1) with a first delay and inverted in phase with respect to CLK;

wherein the third keeper second latch comprises:
a NAND circuit having a first input to accept QbM, a second input to receive CK1, and an output to supply a UP signal with a binary value;
a NOR circuit having a first input to accept QbM, a second input to accept CLK, and an output to supply a DN signal with a binary value;
an eighth PMOS FET having a first S/D connected to the first reference voltage, a gate to accept the UP signal, and a second S/D to provide the QbM signal;
an eighth NMOS FET having a first S/D to provide the QbM signal, a gate to accept the DN signal, and a second S/D connected to the second reference voltage;
a ninth PMOS FET having a first S/D connected to the first reference voltage, a gate to accept the UP signal, and a second S/D to supply the Q signal in the slave hold mode; and,
a ninth NMOS FET having a first S/D connected to the second S/D of the ninth PMOS FET, a gate to accept the DN signal, and a second S/D connected to the second reference voltage.

14. The PSP-FF of claim 11 wherein the third keeper comprises:
a first latch having an input connected to the output of the pre-charge stage, and an output that is transparent with respect to the input in response to the second phase of CLK; and,
a second latch with an input connected to the output of the first latch, and an output connected to supply the Q signal that is transparent with respect to the input in response to the first phase of CLK.

15. The PSP-FF of claim 14 wherein the third keeper first latch comprises:
a seventh PMOS FET having a first S/D connected to the first reference voltage, a gate connected to accept DbMF, and a second S/D connected to supply a QbM signal;
a seventh NMOS FET having a first S/D connected to the second S/D of the seventh PMOS FET, a gate to receive CK2, and a second S/D; and,
an eighth NMOS FET having a first S/D connected to second S/D of the seventh NMOS FET, a gate connected to accept DbMF, and a second S/D connected to the second reference voltage;

wherein the third keeper second latch comprises:
a NAND circuit having a first input to accept QbM, a second input to receive CK1, and an output to supply a UP signal with a binary value;
a NOR circuit having a first input to accept QbM, a second input to accept CLK, and an output to supply a DN signal with a binary value;
an eighth PMOS FET having a first S/D connected to the first reference voltage, a gate to accept the UP signal, and a second S/D to provide the QbM signal;
a ninth NMOS FET having a first S/D to provide the QbM signal, a gate to accept the DN signal, and a second S/D connected to the second reference voltage;
a ninth PMOS FET having a first S/D connected to the first reference voltage, a gate to accept the UP signal, and a second S/D to supply the Q signal in the slave hold mode; and,
a tenth NMOS FET having a first S/D connected to the second S/D of the ninth PMOS FET, a gate to accept the DN signal, and a second S/D connected to the second reference voltage.

16. The PSP-FF of claim 10 further comprising:
a plurality of n pre-dissipation stages, supplying corresponding signals mDb1 through mDbn;
a plurality of n first keepers, each connected to a corresponding pre-dissipation stage; and,
wherein the pre-charge stage comprises a plurality of n third NMOS FETs, each third NMOS FET having a first S/D connected to the second keeper, a gate connected to a corresponding first keeper, and a S/D connected to the first S/D of the fourth NMOS FET.

17. A pseudo single-phase flip-flop (PSP-FF) comprising:
a master section comprising:
a pre-dissipation stage having an input to accept a D1 signal with a binary value, an input to accept a second clock (CK2) that has a second delay, and is in phase with respect to a base clock signal (CLK), and an output to supply a mDb signal with a binary value in a master pass mode, in response to the D1 and CK2;
a first keeper circuit connected to the pre-dissipation stage output to maintain the mDb signal binary value during a master hold mode;
a slave section comprising:
a pre-charge stage having an input to accept the mDb signal, an input to accept CLK and CK2, and an output to charge a DbMF signal with a first binary value during a slave hold mode;
a second keeper connected to the pre-charge stage to maintain the DbMF first binary value in a slave pass mode when the mDb signal has a second binary value opposite in polarity to the first binary value, and to support a DbMF second binary value in the slave pass mode when the mDb signal has the first binary value;
a post-dissipation stage having an input to accept the DbMF signal, an input to accept CK2, and an output to supply a Q signal with a binary value equal to an inverse of the DbMF binary value in the slave pass mode, in response to the DbMF and CK2;
a third keeper connected to the post-dissipation stage to maintain the Q signal binary value during the slave hold mode and,
wherein the pre-charge stage charges the second keeper with the first binary value in response to a first phase of the base and second clocks, and dissipates the second keeper to the second binary value in response to a combination of a second phase of the base clock and the mDb first binary value; and
the pre-dissipation stage discharges the first keeper to the mDb second binary value in response to the D1 first binary value, and selectively charges the first keeper to the mDb first binary value in the master pass mode, the pre-dissipation stage is a clocked NOR gate accepting a D0 signal with a binary value and the D1 signal, and charging the first keeper with the mDb first binary value in the master pass mode when both D0 and D1 have the second binary value.

18. The PSP-FF of claim 17 wherein the pre-dissipation stage NOR gate comprises:
a first PMOS FET having a first S/D connected to a first reference voltage, a gate connected to receive D0, and a second S/D;
a second PMOS FET having a first S/D connected to the second S/D of the first PMOS FET, a gate connect to receive D1, and a second S/D;
a third PMOS FET having a first S/D connected to the second S/D of the second PMOS FET, the third PMOS FET having a gate to receive CK2 and a second S/D connected to the first keeper;

a first NMOS FET having a first S/D connected to the first keeper, a gate connected to accept D1, and a second S/D connected to a second reference voltage having a lower potential than the first reference voltage; and, a second NMOS FET having a first S/D connected to the first keeper, a gate connected to accept D0, and a second S/D connected to the second reference voltage.

19. The PSP-FF of claim 1 wherein the pre-dissipation stage is a clocked NAND gate accepting a D0 signal with a binary value and the D1 signal, and charging the first keeper to the mDb first binary value in the master pass mode when either of D0 or D1 have the second binary value.

20. The PSP-FF of claim 17 wherein the pre-dissipation stage is a clocked NAND gate accepting a D0 signal with a binary value and the D1 signal, and charging the first keeper to the mDb first binary value in the master pass mode when either of D0 or D1 have the second binary value.

\* \* \* \* \*